(12) United States Patent
Komori

(10) Patent No.: US 9,905,510 B2
(45) Date of Patent: Feb. 27, 2018

(54) SEMICONDUCTOR MEMORY DEVICE AND METHOD OF MANUFACTURING THE SAME

(71) Applicant: TOSHIBA MEMORY CORPORATION, Minato-ku (JP)

(72) Inventor: Yosuke Komori, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/433,451

(22) Filed: Feb. 15, 2017

(65) Prior Publication Data

US 2017/0236779 A1    Aug. 17, 2017

(30) Foreign Application Priority Data

Feb. 17, 2016   (JP) ................... 2016-028195

(51) Int. Cl.
| | |
|---|---|
| H01L 21/28 | (2006.01) |
| H01L 23/522 | (2006.01) |
| H01L 27/1157 | (2017.01) |
| H01L 27/11582 | (2017.01) |
| H01L 23/528 | (2006.01) |
| H01L 23/532 | (2006.01) |
| H01L 21/768 | (2006.01) |

(52) U.S. Cl.
CPC .... *H01L 23/5228* (2013.01); *H01L 21/28282* (2013.01); *H01L 21/76816* (2013.01); *H01L 21/76843* (2013.01); *H01L 21/76877* (2013.01); *H01L 23/528* (2013.01); *H01L 23/5226* (2013.01); *H01L 23/53266* (2013.01); *H01L 27/1157* (2013.01); *H01L 27/11582* (2013.01)

(58) Field of Classification Search
CPC . H01L 23/5228; H01L 23/58; H01L 23/5226; H01L 27/11582; H01L 21/76816; H01L 21/76843; H01L 23/53266; H01L 27/1157; H01L 21/76877; H01L 21/28282
See application file for complete search history.

(56) References Cited

U.S. PATENT DOCUMENTS

| | | | | |
|---|---|---|---|---|
| 4,087,900 | A * | 5/1978 | Yiannoulos | ......... H01L 21/8222 148/DIG. 38 |
| 9,721,668 | B2 * | 8/2017 | Yeh | ......................... G11C 16/14 |
| 2007/0252201 | A1 | 11/2007 | Kito et al. | |

(Continued)

FOREIGN PATENT DOCUMENTS

| | | |
|---|---|---|
| JP | 2007-266143 | 10/2007 |
| JP | 2009-146954 | 7/2009 |

*Primary Examiner* — Jarrett Stark
(74) *Attorney, Agent, or Firm* — Oblon, McClelland, Maier & Neustadt, L.L.P.

(57) ABSTRACT

According to one embodiment, a semiconductor memory device includes, a first interconnect layer provided on a first insulating layer and including a first conductive layer, a second interconnect layer provided on a second insulating layer above the first interconnect layer and including a second conductive layer having a composition different from that of the first conductive layer, and a pillar extending through the first and second insulating layers and the first and second interconnect layers and including a semiconductor layer, and a third insulating layer, a charge storage layer, and a fourth insulating layer, which are stacked on a side surface of the semiconductor layer.

10 Claims, 25 Drawing Sheets

(56) References Cited

U.S. PATENT DOCUMENTS

| | | |
|---|---|---|
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0146769 A1* | 6/2011 | Hoffbauer ................ C08J 7/123 |
| | | 136/255 |
| 2011/0284946 A1 | 11/2011 | Kiyotoshi |
| 2012/0069663 A1 | 3/2012 | Itagaki et al. |
| 2016/0240554 A1 | 8/2016 | Fukuzumi et al. |
| 2017/0170125 A1* | 6/2017 | Furumoto ......... H01L 23/53266 |
| 2017/0236779 A1* | 8/2017 | Komori ............... H01L 23/5228 |
| | | 257/326 |

* cited by examiner

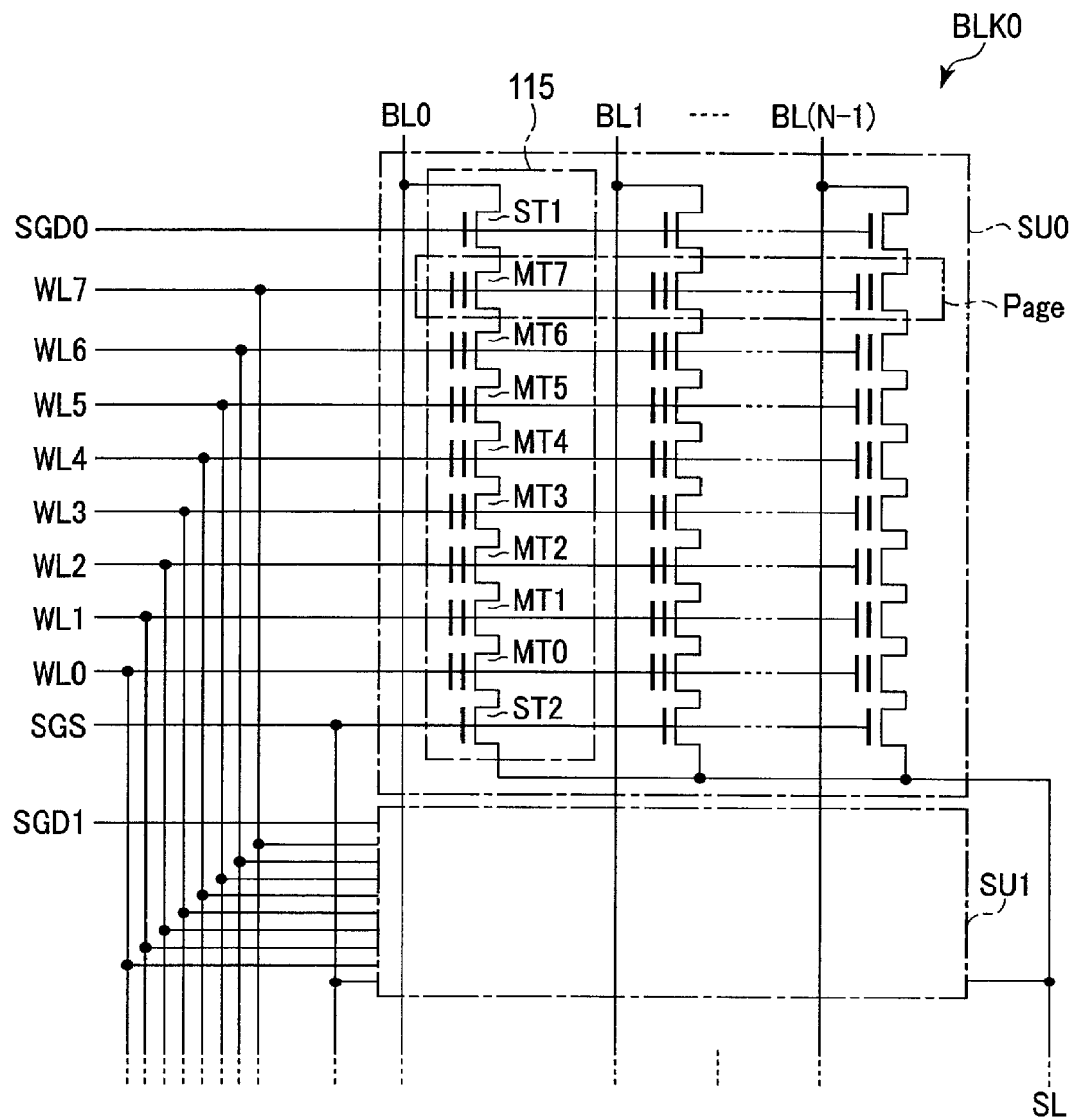
F I G. 2

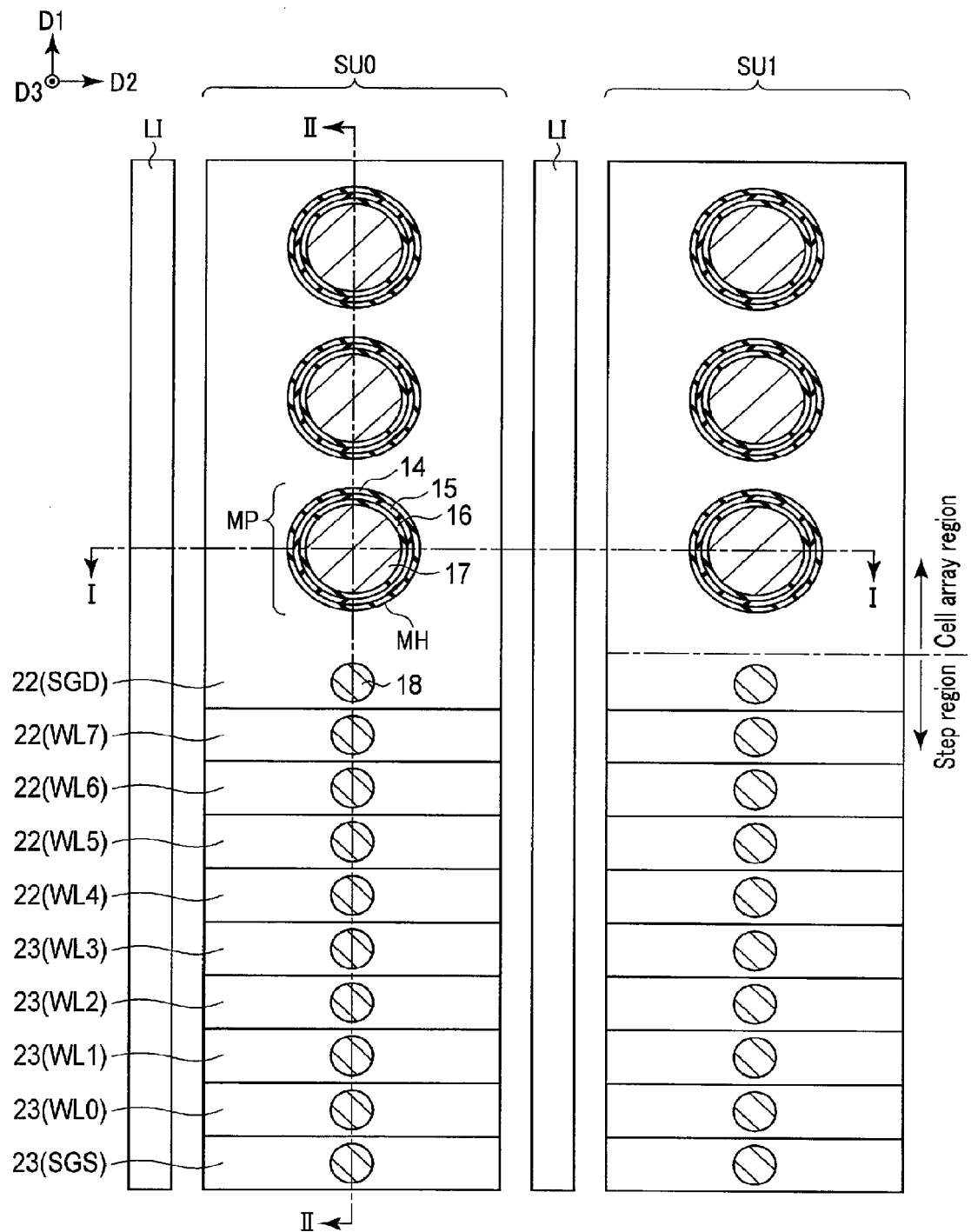
F I G. 3

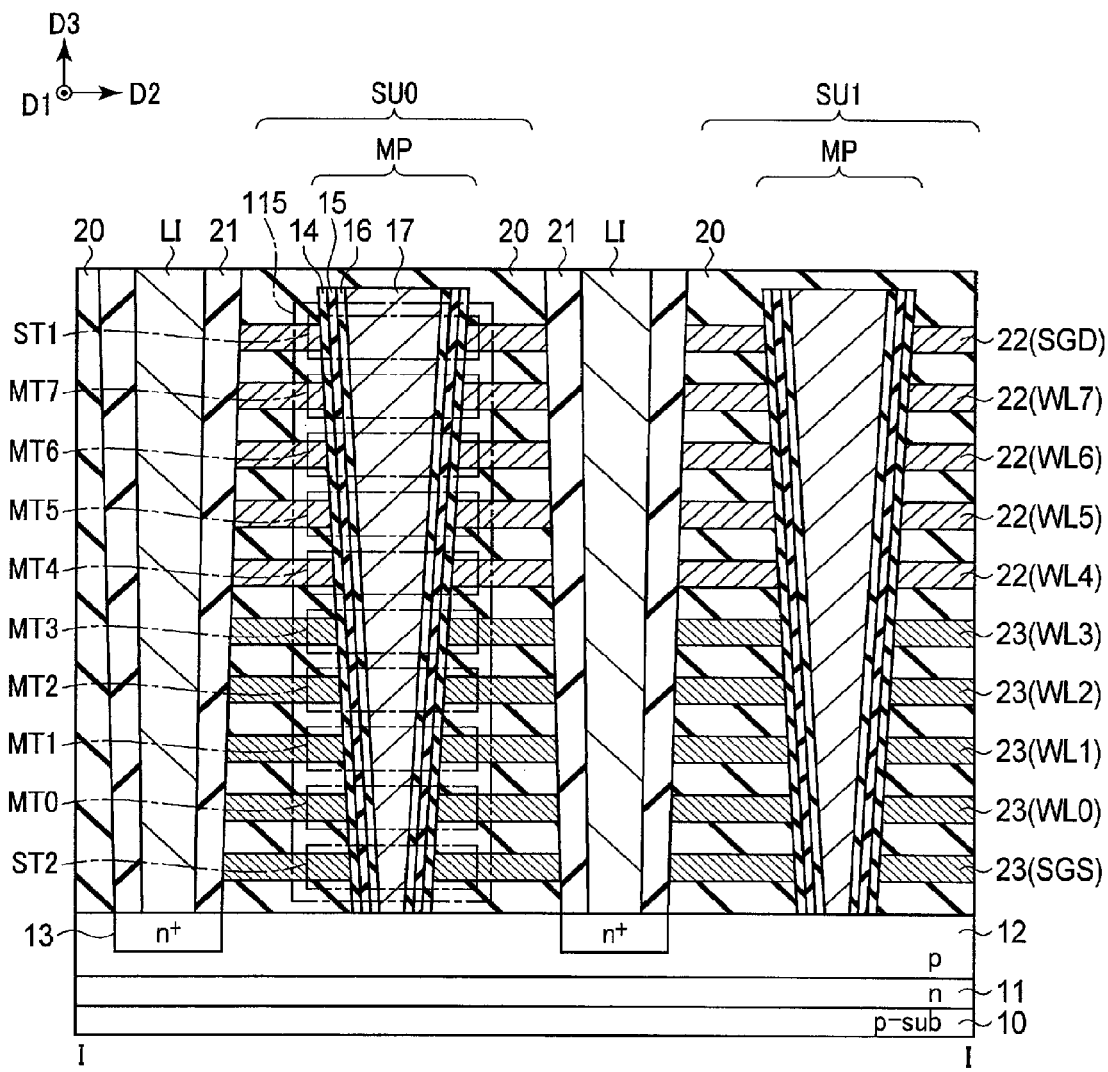
F I G. 4

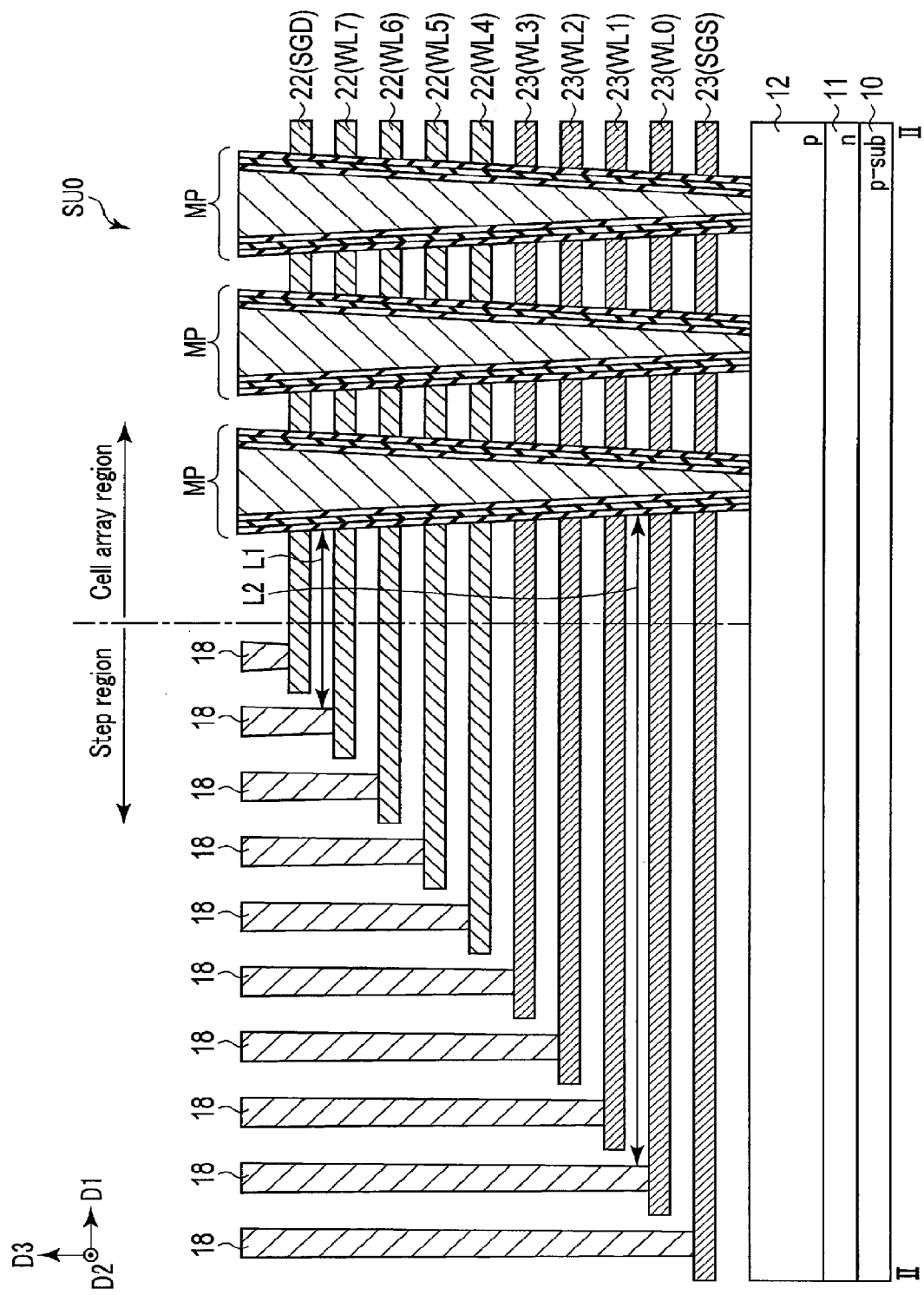
F I G. 5

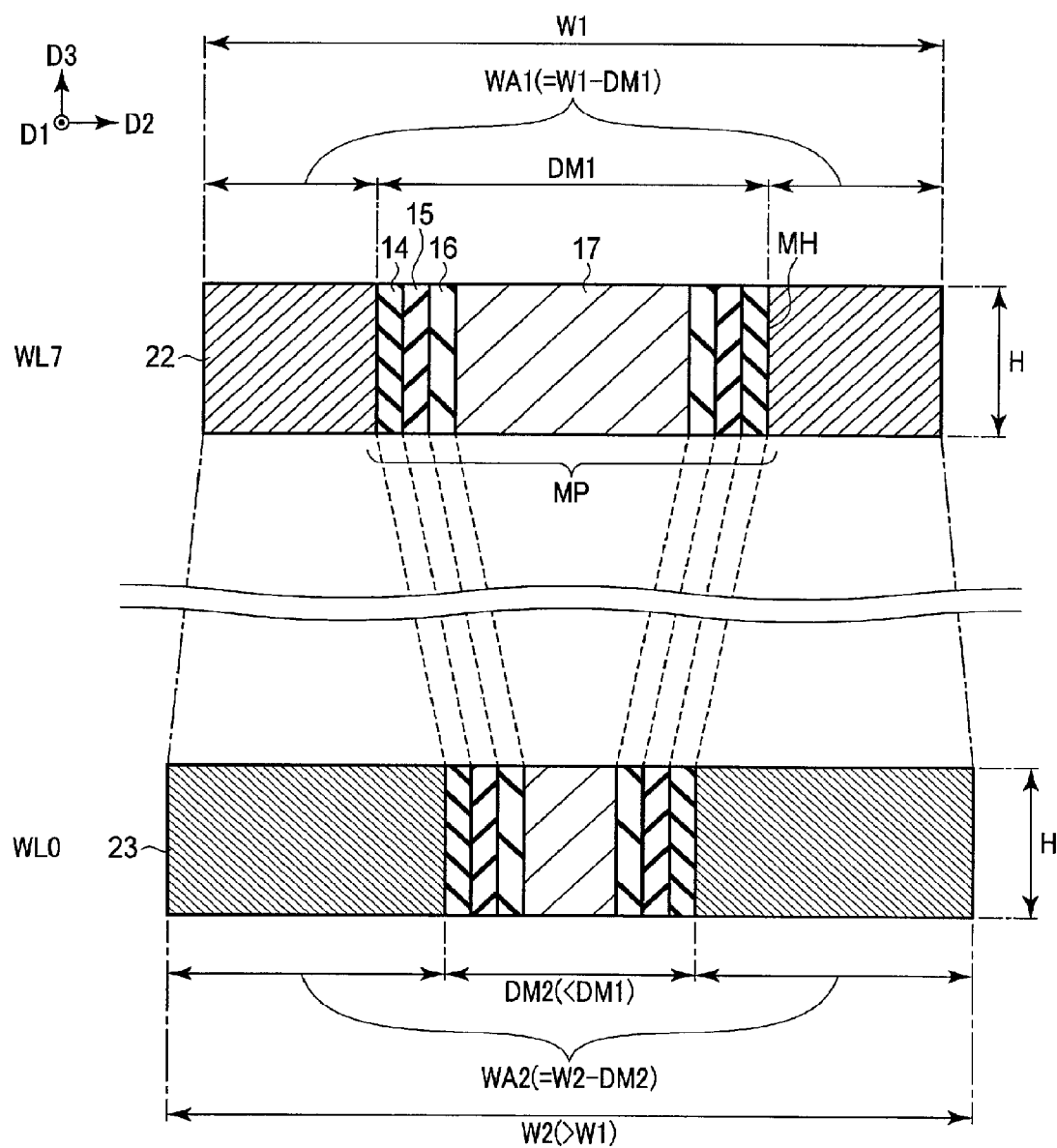
F I G. 6

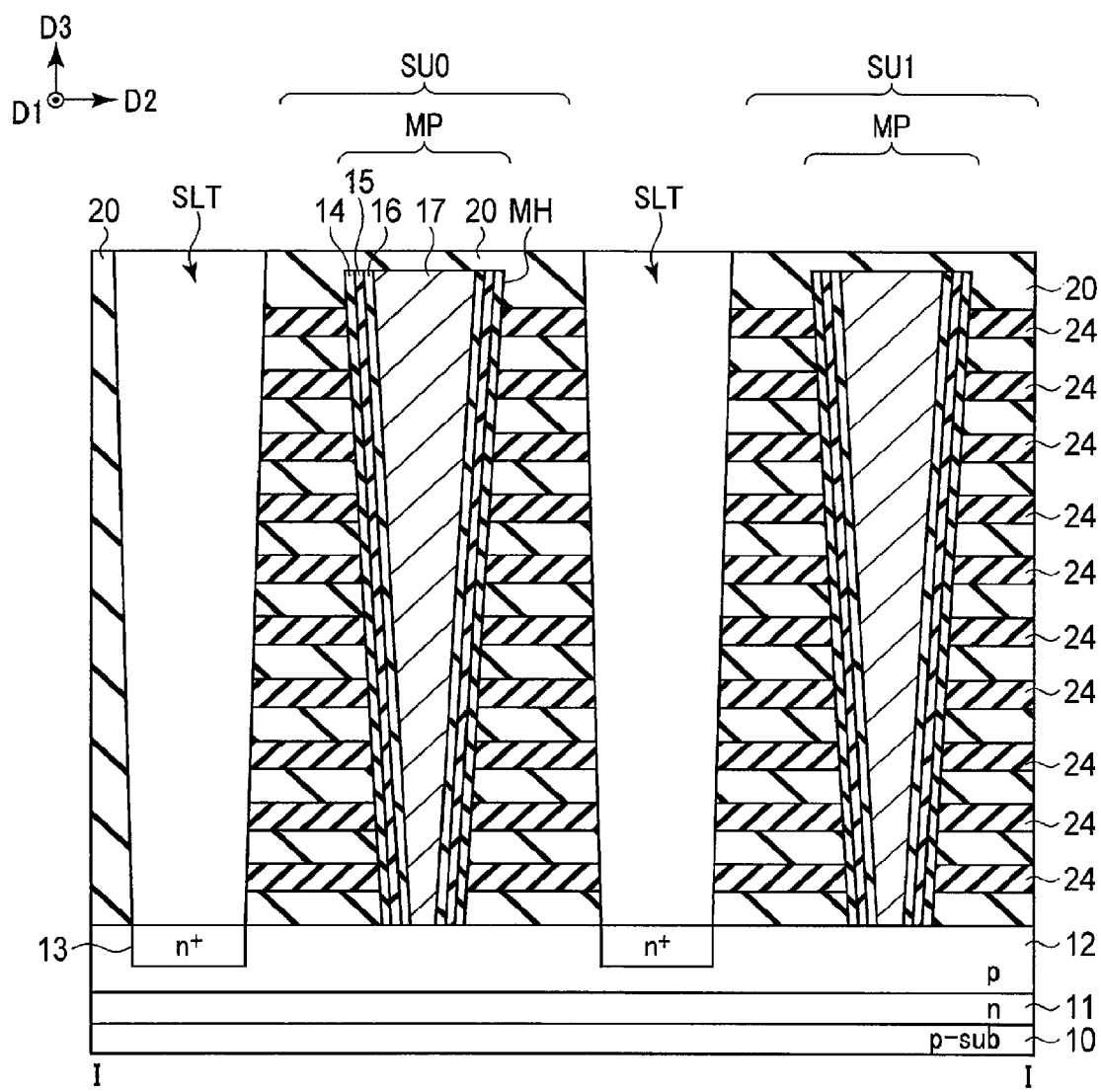
F I G. 7

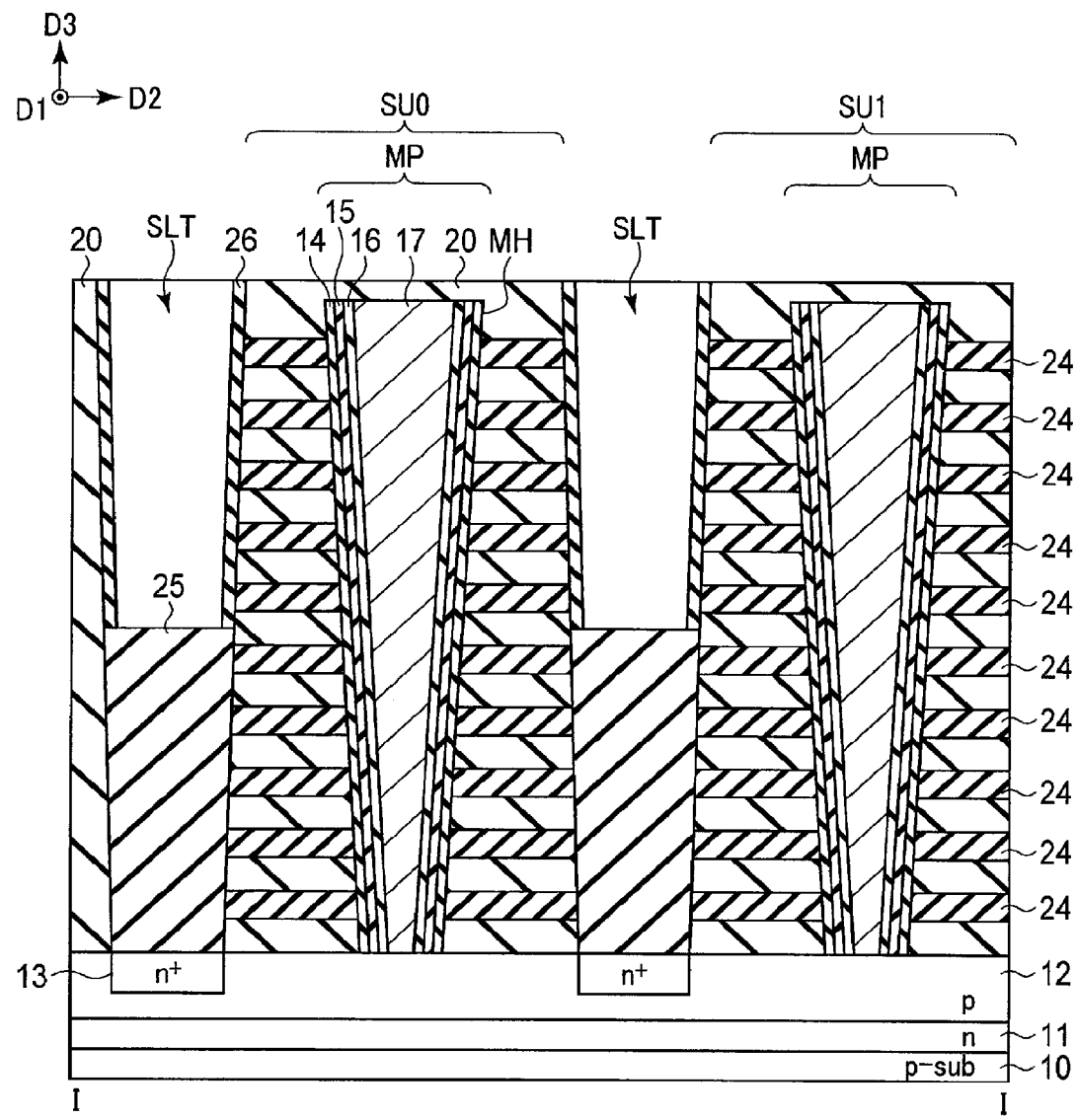
F I G. 10

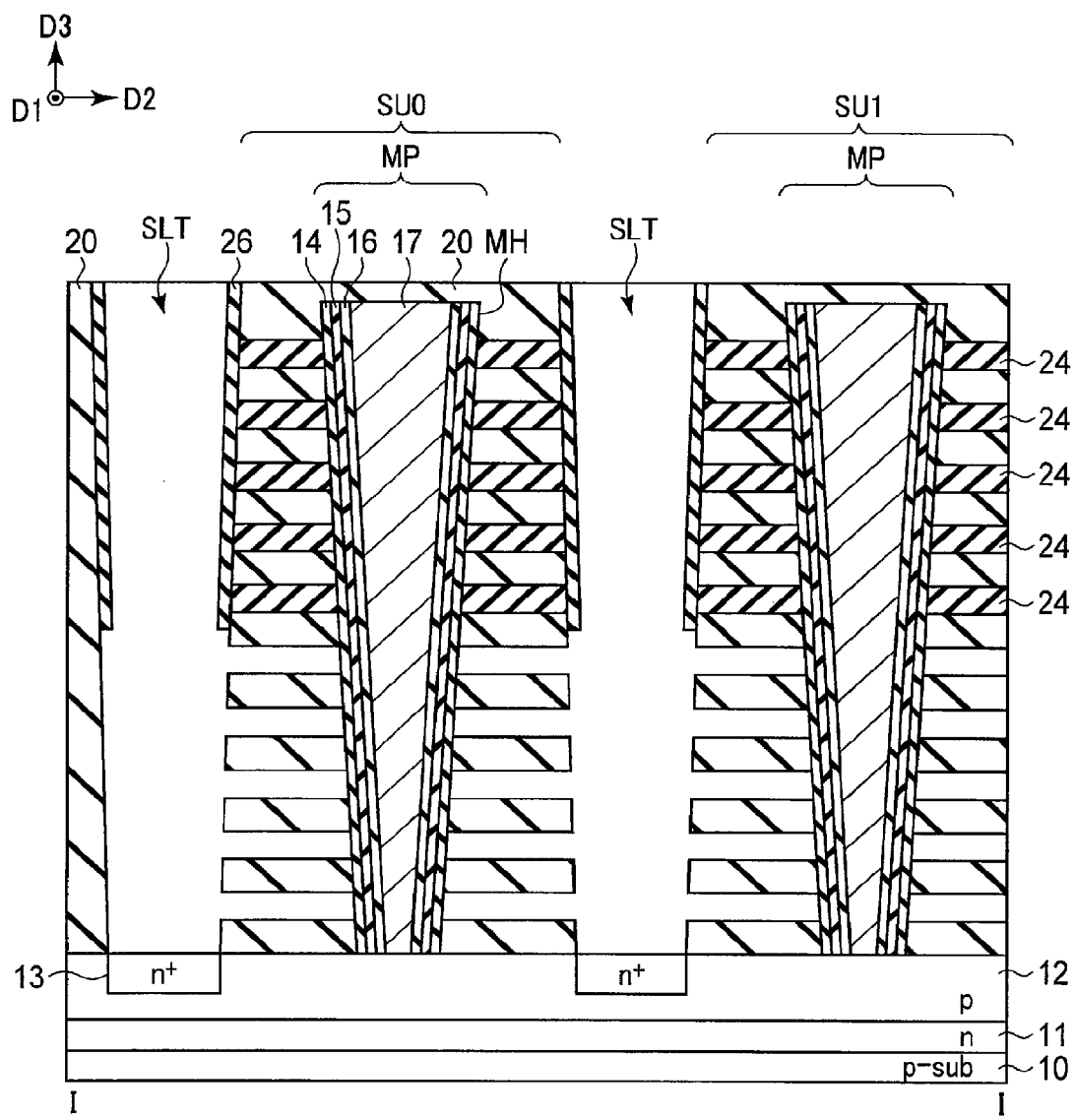
F I G. 11

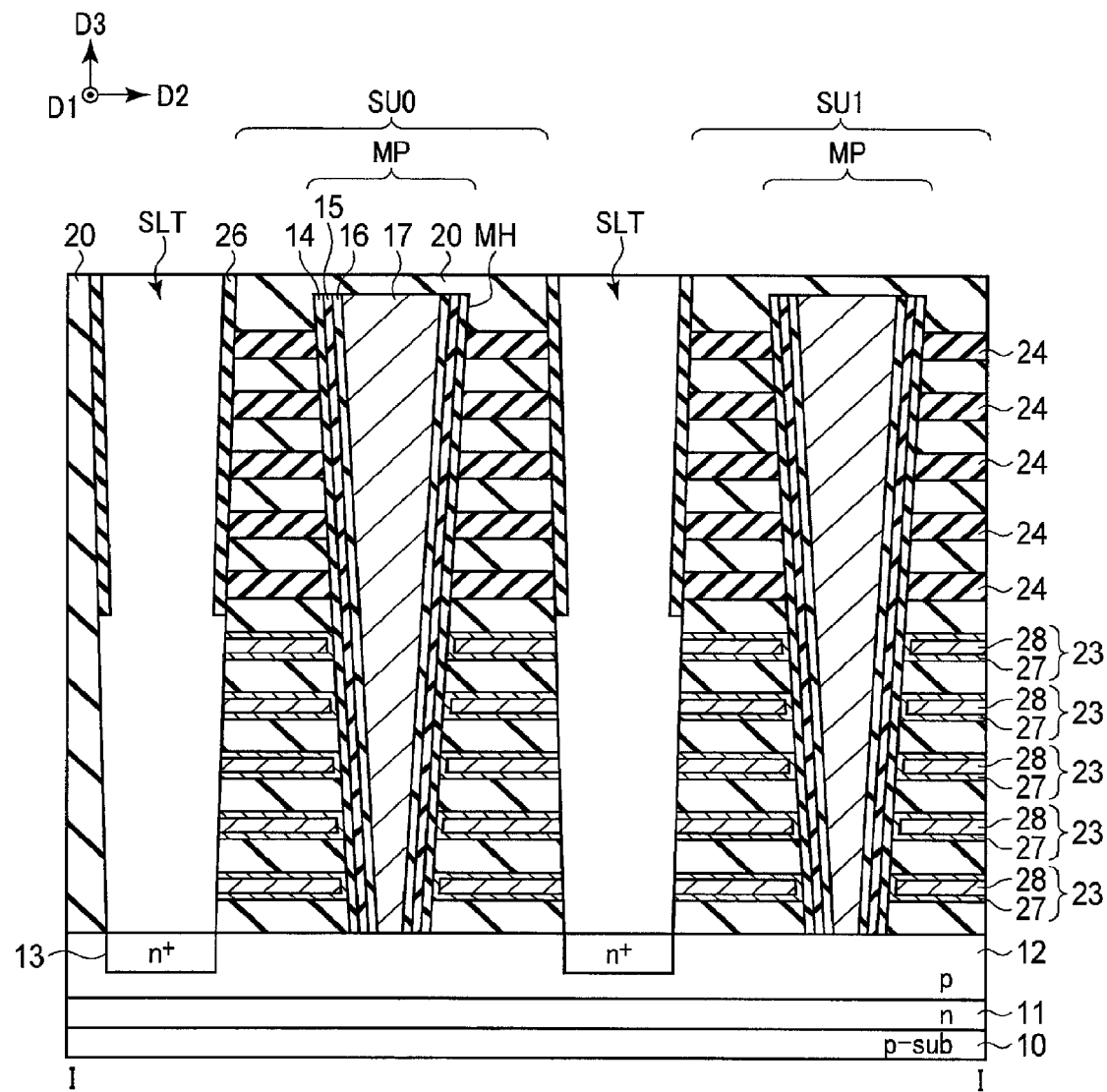
F I G. 13

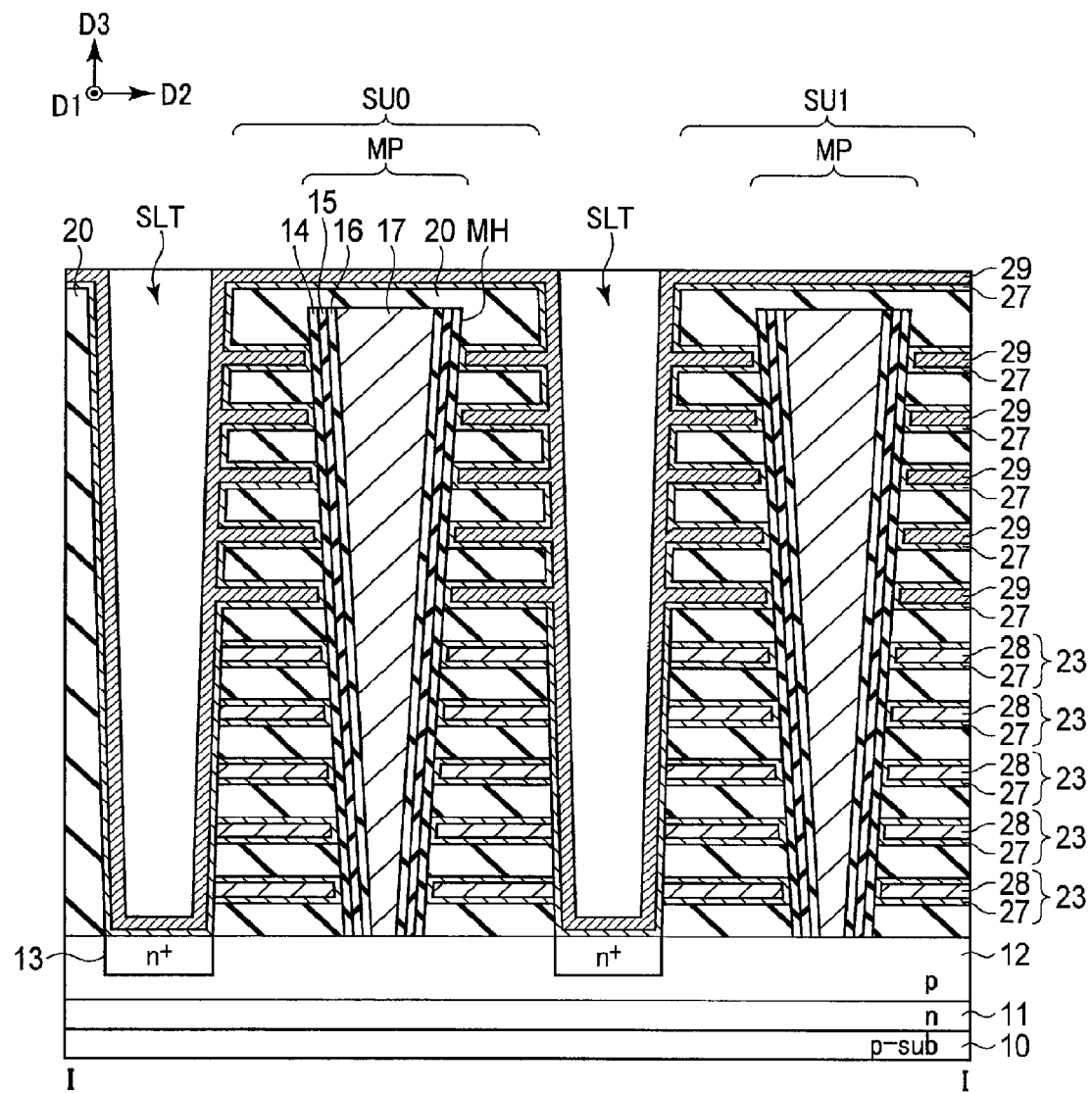
F I G. 16

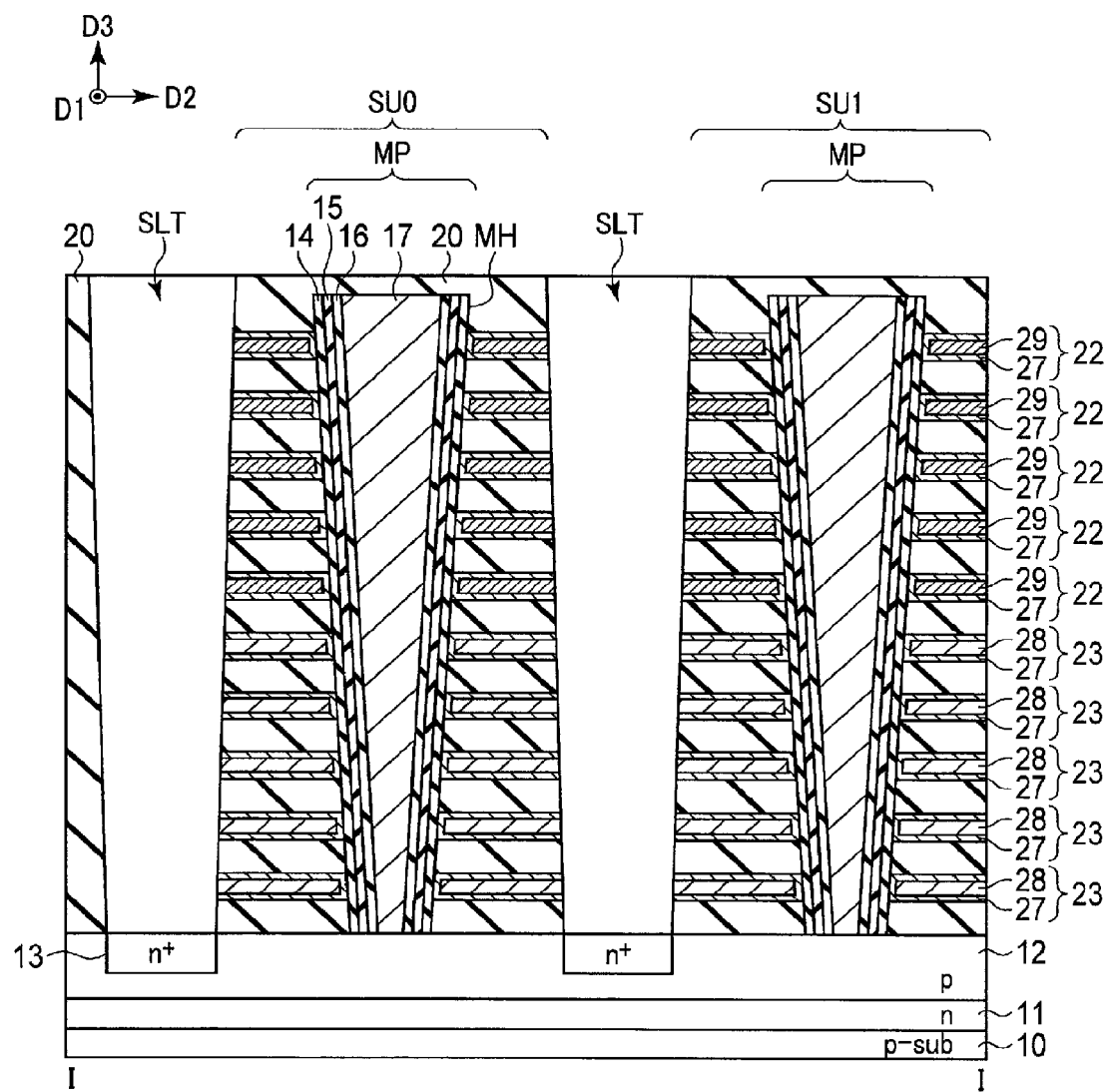
F I G. 17

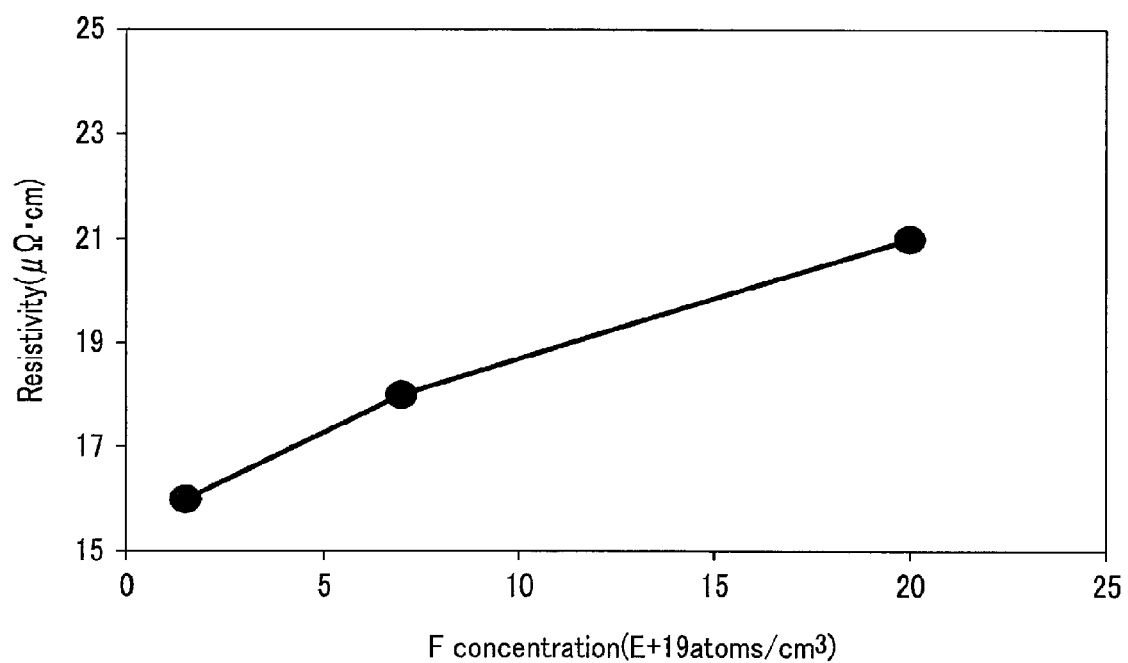
F I G. 18

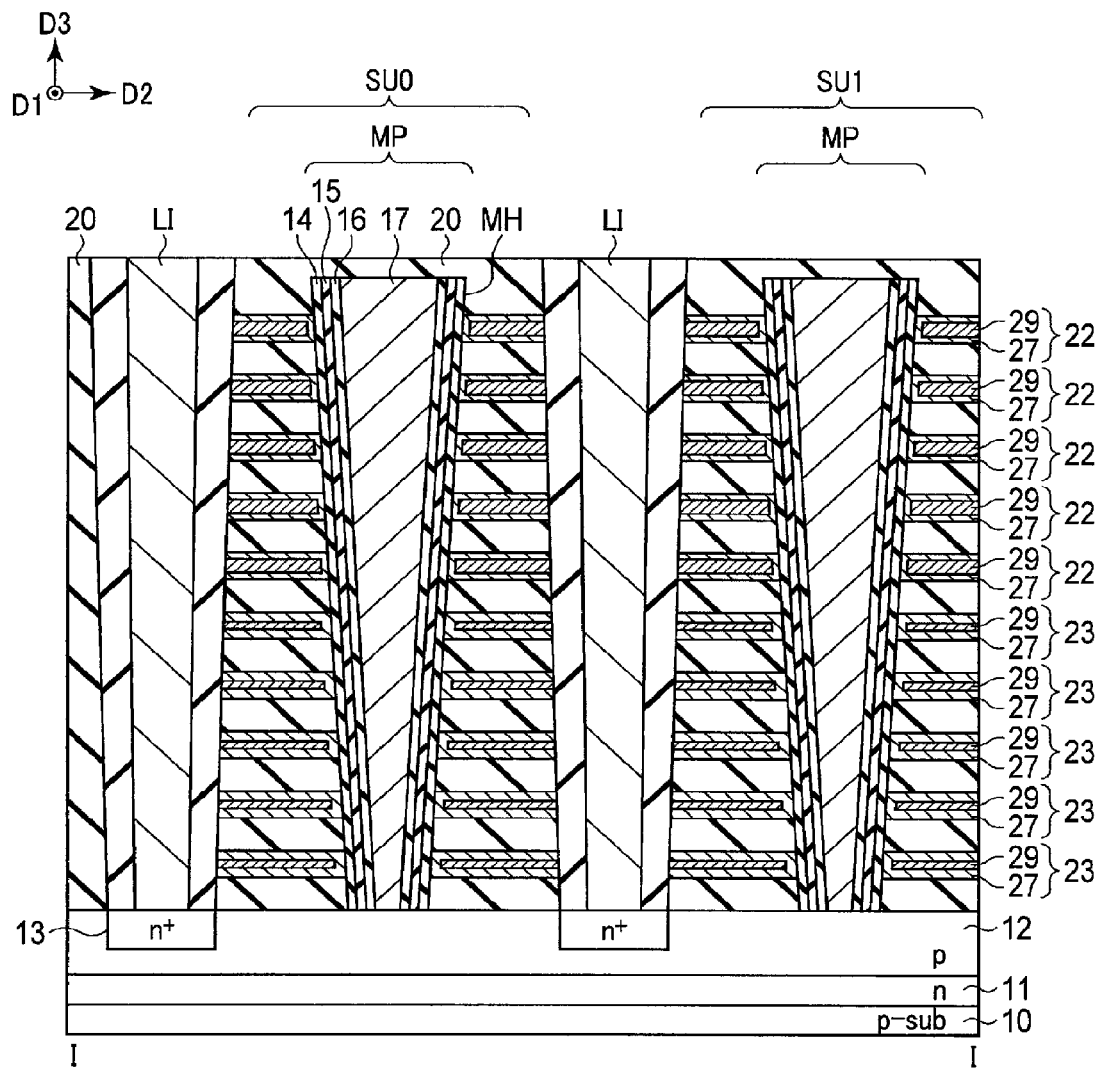
F I G. 19

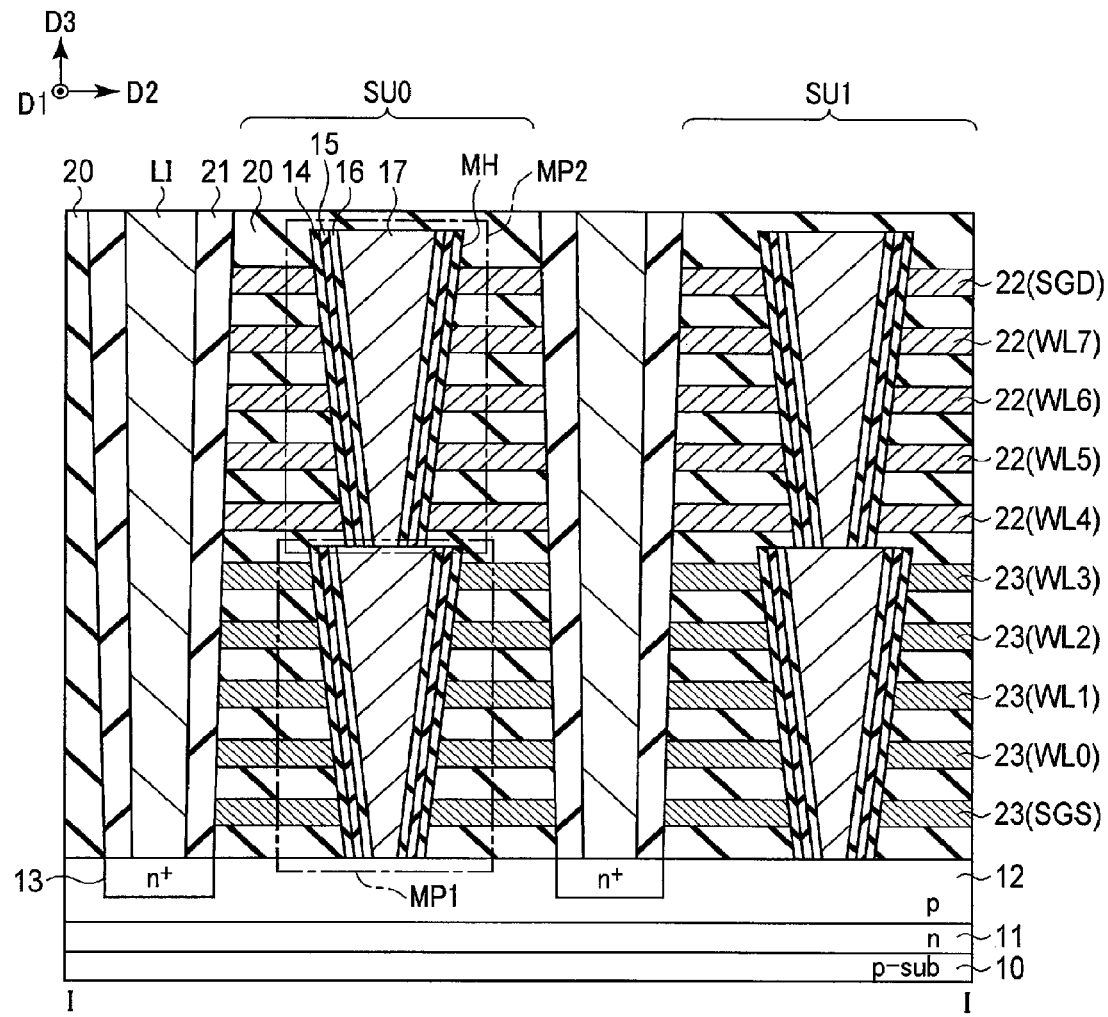
F I G. 20

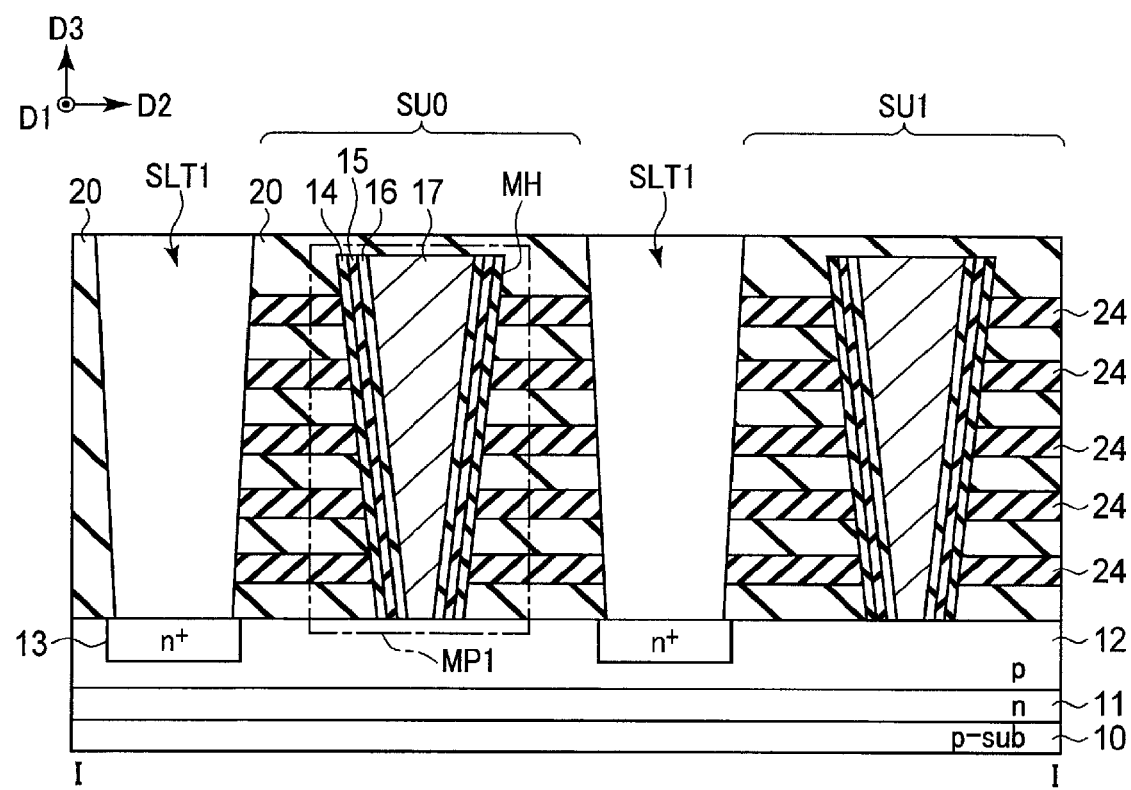
F I G. 21

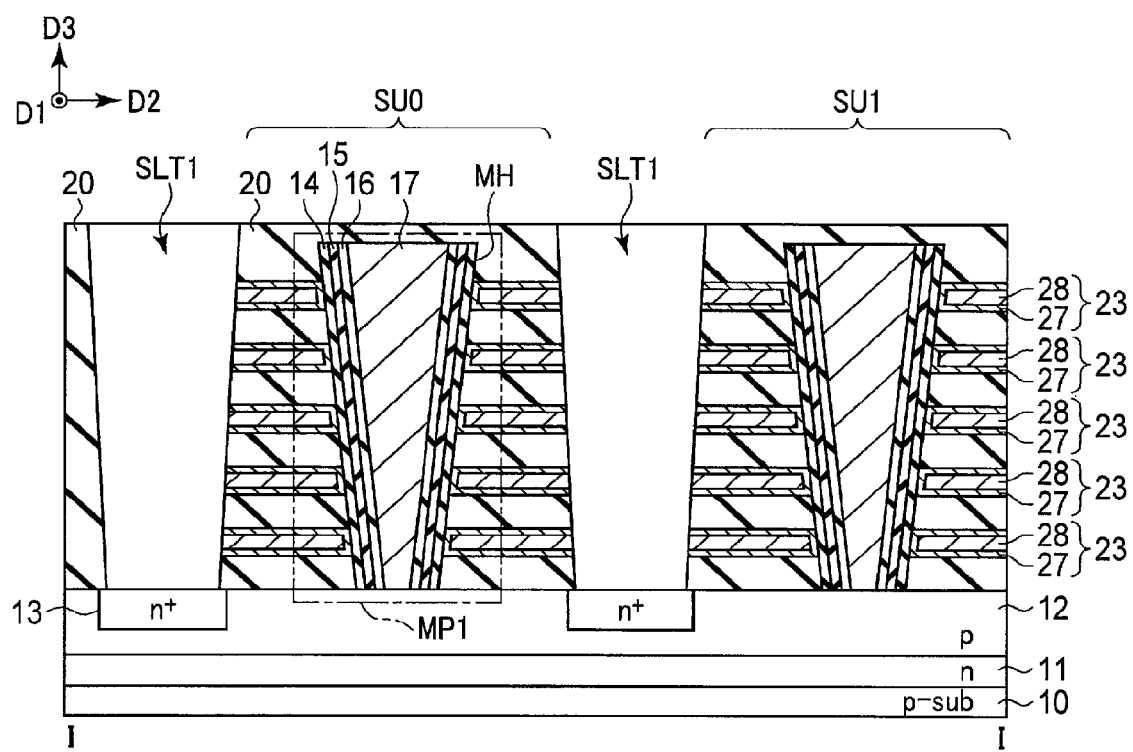
F I G. 22

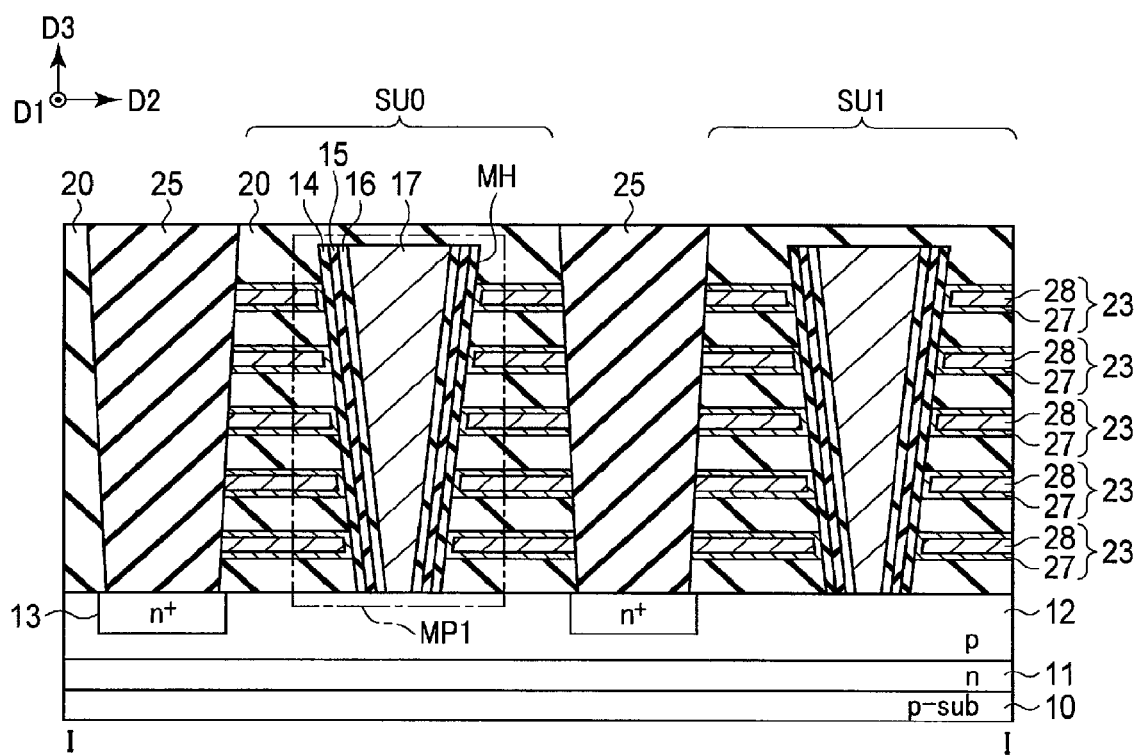
F I G. 23

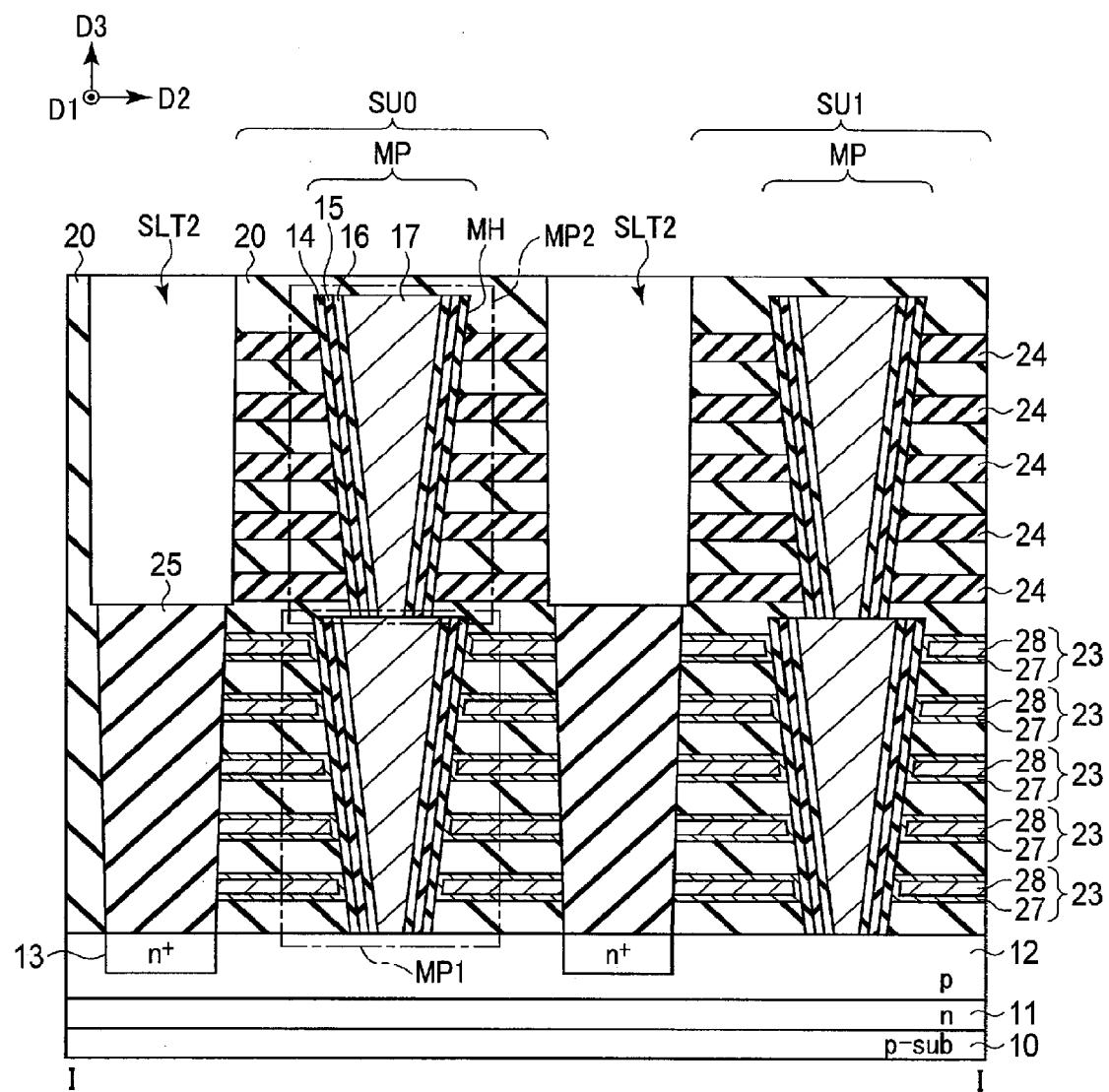
F I G. 24

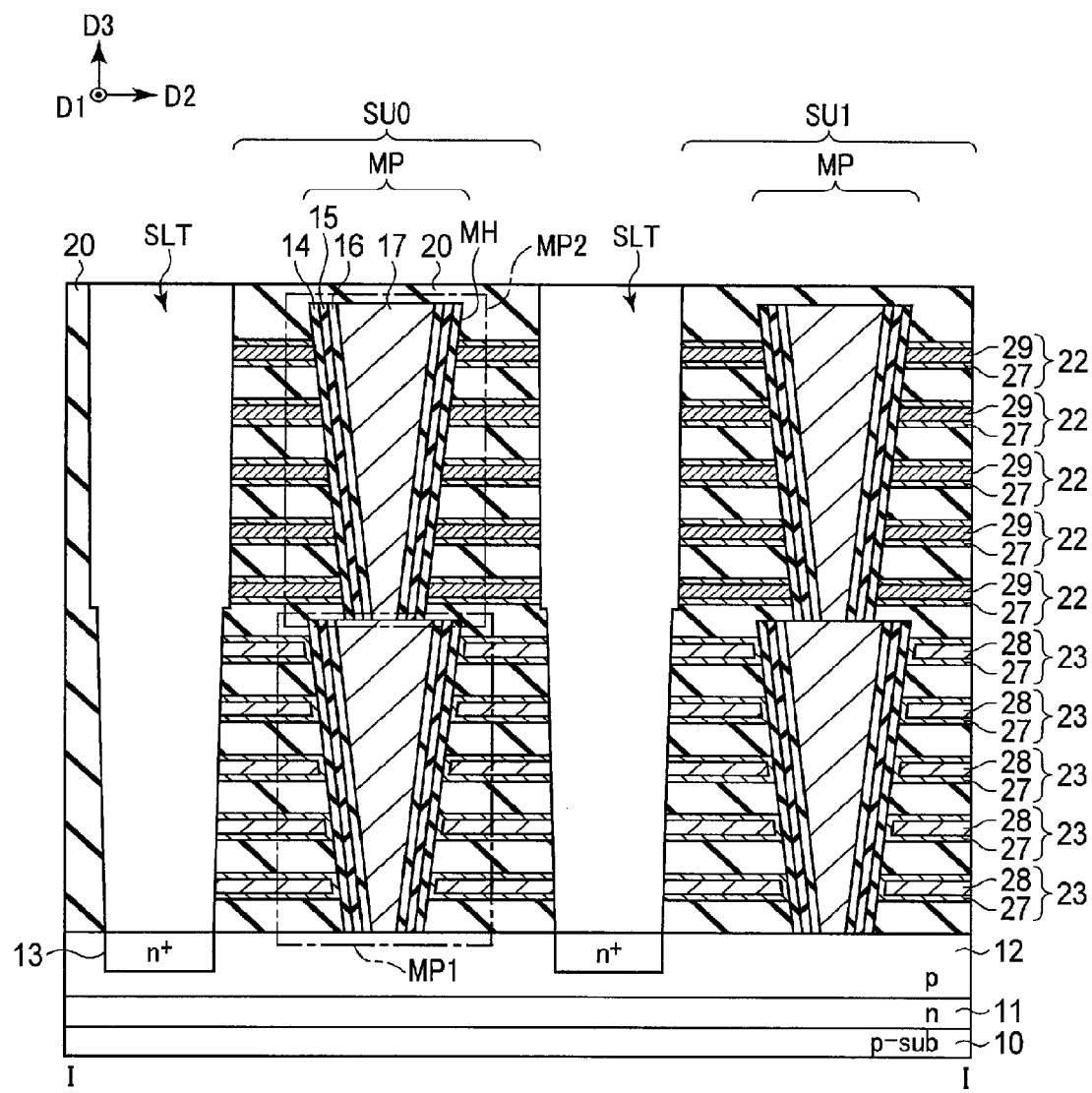
F I G. 25

SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2016-028195, filed Feb. 17, 2016, the entire contents of which are incorporated herein by reference.

FIELD

Embodiments described herein relate generally to a semiconductor memory device and a method of manufacturing the same.

BACKGROUND

As a semiconductor memory device, there is known a NAND flash memory.

BRIEF DESCRIPTION OF THE DRAWINGS

FIG. 2 is a circuit diagram showing the semiconductor memory device according to the first embodiment;

FIG. 3 is a plan view showing a memory cell array in the semiconductor memory device according to the first embodiment;

FIG. 4 is a sectional view taken along a line I-I in FIG. 3;

FIG. 5 is a sectional view taken along a line II-II in FIG. 3;

FIG. 6 is a sectional view showing a word line in the uppermost layer and a word line in the lowermost layer in the semiconductor memory device according to the first embodiment;

FIGS. 7 to 17 are sectional views showing steps of manufacturing the semiconductor memory device according to the first embodiment;

FIG. 18 is a graph showing the relationship between the resistivity of tungsten and the fluorine concentration in the tungsten film;

FIG. 19 is a sectional view showing a memory cell array in a semiconductor memory device according to the second embodiment;

FIG. 20 is a sectional view showing a memory cell array in a semiconductor memory device according to the third embodiment; and FIGS. 21 to 25 are sectional views showing steps of manufacturing the semiconductor memory device according to the third embodiment.

DETAILED DESCRIPTION

In general, according to one embodiment, a semiconductor memory device includes a first interconnect layer provided on a first insulating layer above a semiconductor substrate and including a first conductive layer, a second interconnect layer provided on a second insulating layer above the first interconnect layer and including a second conductive layer having a film composition different from that of the first conductive layer, and a pillar extending through the first and second insulating layers and the first and second interconnect layers and including a semiconductor layer, and a third insulating layer, a charge storage layer, and a fourth insulating layer, which are stacked on a side surface of the semiconductor layer.

1. First Embodiment

A semiconductor device and a method of manufacturing the same according to the first embodiment will be described. A 3D stacked NAND flash memory in which memory cell transistors are stacked above a semiconductor substrate will be exemplified below as the semiconductor device.

1.1 Configuration

1.1.1 Overall Configuration of Semiconductor Device

Figure 1:
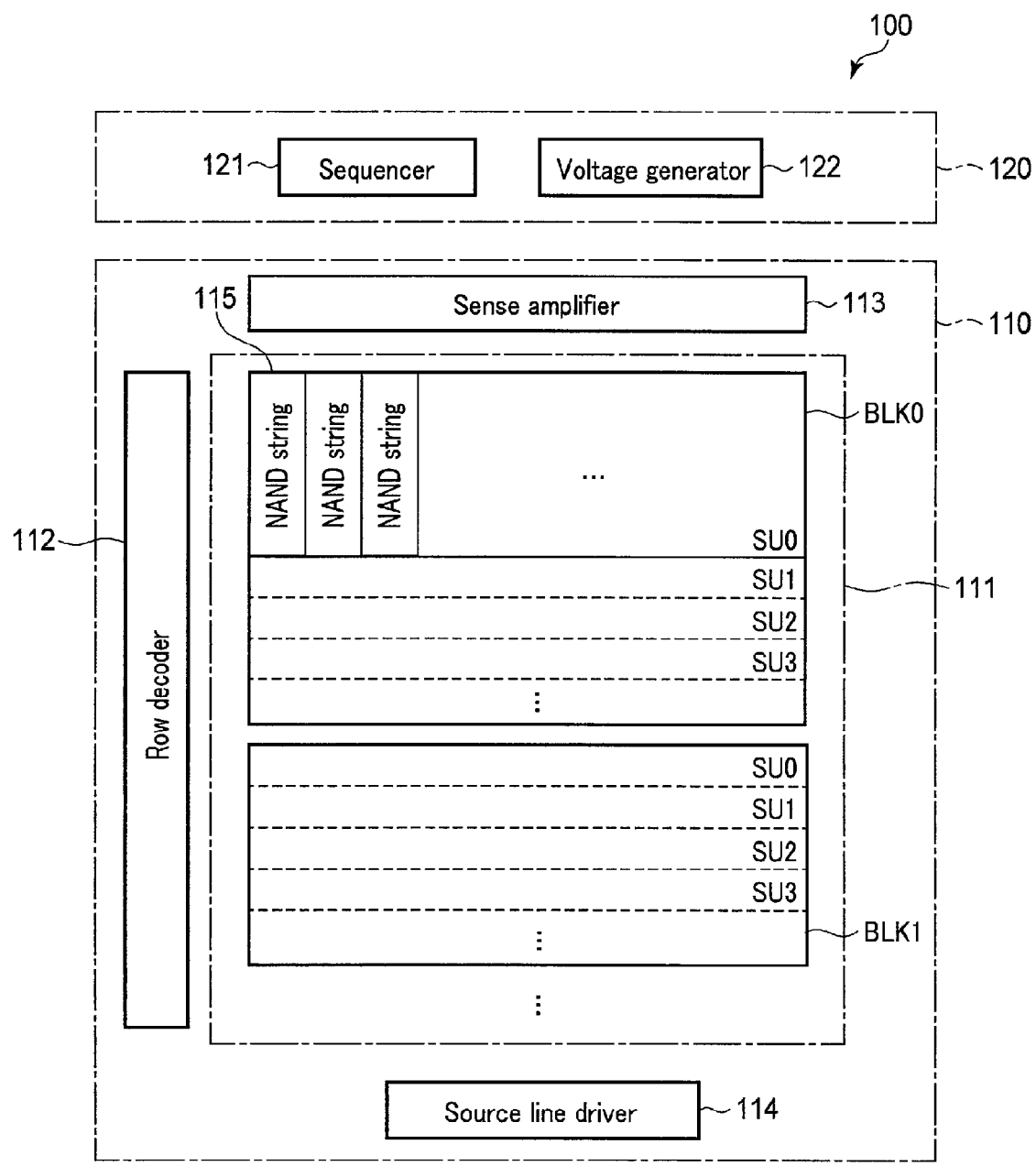
FIG. 1 is a block diagram showing a semiconductor memory device according to the first embodiment.

The overall configuration of a semiconductor memory device will first be described with reference to FIG. 1. As shown in FIG. 1, a NAND flash memory 100 roughly includes a core unit 110 and a peripheral circuit unit 120.

The core unit 110 includes a memory cell array 111, a row decoder 112, a sense amplifier 113, and a source line driver 114.

The memory cell array 111 includes a plurality of blocks BLK (BLK0, BLK1, . . . ) each of which is a set of a plurality of nonvolatile memory cell transistors. For example, data in the same block BLK are erased at once.

Each of the blocks BLK includes a plurality of string units SU (SU0, SU1, . . . ). Each of the string units SU includes a plurality of NAND strings 115. In each of the NAND strings 115, a plurality of memory cell transistors are serially coupled. Note that the number of blocks BLK, the number of string units SU, and the number of NAND strings 115 in the memory cell array 111 are arbitrary.

At the time of, for example, data write and read, the row decoder 112 decodes the address of the block BLK or the address of a page, and selects a target word line.

At the time of data read, the sense amplifier 113 senses data read from the memory cell transistors to bit lines. At the time of data write, the sense amplifier 113 transfers write data to the memory cell transistors.

The source line driver 114 applies a necessary voltage to a source line when writing, reading, or erasing data.

The peripheral circuit unit 120 includes a sequencer 121 and a voltage generator 122.

The sequencer 121 controls the overall operation of the NAND flash memory 100.

The voltage generator 122 generates a voltage necessary to write, read, and erase data, and applies it to the row decoder 112, the sense amplifier 113, the source line driver 114, and the like.

1.1.2 Configuration of Memory Cell Array

The configuration of the memory cell array 111 will be described next with reference to FIG. 2.

As shown in FIG. 2, each of the NAND strings 115 includes, for example, eight memory cell transistors MT (MT0 to MT7) and select transistors ST1 and ST2. Each of the memory cell transistors MT includes a stacked gate with a control gate and a charge storage layer, and nonvolatilely holds data. Note that each of the memory cell transistors MT may be of the MONOS type which uses an insulating film for the charge storage layer, or the FG type which uses a conductive layer for the charge storage layer. In this embodiment, the MONOS type will be exemplified below. In addition, the number of memory cell transistors MT is not limited to eight, and may be 16, 32, 64, 128, or the like. The number of memory cell transistors is not specifically limited. The number of select transistors ST1 and the number of select transistors ST2 are arbitrary.

The current paths of the memory cell transistors MT0 to MT7 are serially coupled. The drain of the memory cell transistor MT7 is coupled to the source of the select transistor ST1, and the source of the memory cell transistor MT0 is coupled to the drain of the select transistor ST2.

The gates of the select transistors ST1 in the same string unit SU are commonly coupled to a select gate line SGD. In the example of FIG. 2, the gates of the select transistors ST1 in the string unit SU0 in the block BLK0 are commonly coupled to a select gate line SGD0, and the gates of the select transistors ST1 (not shown) in the string unit SU1 are commonly coupled to a select gate line SGD1.

The gates of the select transistors ST2 in the same block BLK are commonly coupled to a select gate line SGS.

The control gates of the memory cell transistors MT0 to MT7 of the NAND strings 115 in the same block ELK are commonly coupled to different word lines WL0 to WL7, respectively.

In addition, the drains of the select transistors ST1 of the NAND strings 115 on the same row among the NAND strings 115 arranged in a matrix in the memory cell array 111 are respectively coupled to different bit lines BL (BL0 to BL(N−1) ((N−1) is a natural number of 1 or more)), and the drains of the select transistors ST1 of the NAND strings 115 on the same column are commonly coupled to one of the bit lines BL0 to BL(N−1). That is, each of the bit lines BL commonly couples the NAND strings 115 among the plurality of blocks BLK. Furthermore, the sources of the select transistors ST2 in each block BLK are commonly coupled to a source line SL. That is, the source line SL commonly couples the NAND strings 115 among, for example, the plurality of blocks BLK.

Data read and write are performed at once for the memory cell transistors MT coupled to one of the word lines WL in one of the string units SU. This unit is called "page".

A data erase range is not limited to one block BLK. Data in a plurality of blocks BLK may be erased at once or data in a partial region in one block BLK may be erased at once.

Note that the data erase operation is described in, for example, U.S. patent application Ser. No. 12/694,690 "Non-volatile Semiconductor Storage Device" filed Jan. 27, 2010. The data erase operation is also described in U.S. patent application Ser. No. 13/235,389 "Nonvolatile Semiconductor Memory Device" filed Sep. 18, 2011. The entire contents of the patent applications are incorporated by reference in this specification.

Furthermore, the configuration of the memory cell array 111 in the 3D stacked NAND flash memory is described in, for example, U.S. patent application Ser. No. 12/407,403 "Three Dimensional Stacked Nonvolatile Semiconductor Memory" filed Mar. 19, 2009. The configuration is also described in U.S. patent application Ser. No. 12/406,524 "Three Dimensional Stacked Nonvolatile Semiconductor Memory" filed Mar. 18, 2009, U.S. patent application Ser. No. 12/679,991 "Non-volatile Semiconductor Storage Device and Method of Manufacturing the Same" filed Mar. 25, 2010, and U.S. patent application Ser. No. 12/532,030 "Semiconductor Memory and Method for Manufacturing Same" filed Mar. 23, 2009. The entire contents of the patent applications are incorporated by reference in this specification.

1.1.3 Planar Configuration of Memory Cell Array

The planar configuration of the memory cell array will be described next with reference to FIG. 3. Note that no insulating layers are shown in FIG. 3.

As shown in FIG. 3, a plurality of layers LI are periodically arranged in a second direction D2, and one string unit SU is arranged between two layers LI. Note that the layer LI may be a source line contact or an insulator film. In this embodiment, the source line contact LI will be exemplified below. The source line contact LI couples the semiconductor substrate and the source line SL (not shown) provided above the NAND strings 115. Note that the source line contact LI may be not coupled to the semiconductor substrate. In this case, the source line contact LI is coupled the NAND string 115 through the conductive layer (for example, poly-silicon (Poly-Si) or tungsten silicide (WSi)). Each string unit SU includes a cell array region with the plurality of NAND strings 115 and a step region in which a plurality of interconnect layers 22 and 23 extend stepwise, and are respectively coupled to contact plugs 18.

The cell array region will be described first. In the cell array region, a plurality of memory pillars MP are arranged in a row in a first direction D1. A block insulating film 14, a charge storage layer 15, and a tunnel insulating film 16 are sequentially stacked on the side surface of each memory pillar MP, and a semiconductor layer 17 is buried in the memory pillar MP. This semiconductor layer functions as the current path of the NAND string 115. In this embodiment, one memory pillar MP corresponds to one NAND string 115. Note that in the example of FIG. 3, for the sake of descriptive simplicity, the plurality of NAND strings 115 are arrayed in a row in the first direction D1 in one string unit SU. However, an array of NAND strings 115 in one string unit SU can be arbitrarily set. For example, the NAND strings 115 may be parallelly arranged in two rows in the first direction D1, or arrayed in four rows in a staggered pattern. Furthermore, in the example of FIG. 3, one string unit SU includes the three NAND strings 115. However, the number of NAND strings 115 in one string unit SU can be arbitrarily set.

The step region will be described next. In the step region, the plurality of interconnect layers 22 corresponding to the select gate line SGD and the word lines WL4 to WL7 and the plurality of interconnect layers 23 corresponding to the select gate line SGS and the word lines WL0 to WL3 extend stepwise, and are coupled to the contact plugs 18 to be electrically coupled to upper interconnect layers (not shown). Note that in the step region, a plurality of dummy pillars (not shown) coupled to a semiconductor substrate 10 through the plurality of interconnect layers 22 and 23 may be provided. In this case, each dummy pillar has an insulating layer formed on its side surface not to electrically couple the plurality of interconnect layers 22 and 23. The dummy pillar is not electrically coupled to any other interconnect.

1.1.4 Sectional Configuration of Memory Cell Array

The sectional configuration of the memory cell array will be described next with reference to FIGS. 4 and 5. FIG. 4 is a sectional view taken along a line I-I in FIG. 3, and obtained by cutting the source line contacts LI and the NAND strings 115 of the string units SU0 and SU1 in a direction (the second direction D2 parallel to the semiconductor substrate) perpendicular to a direction in which the word lines WL extend. FIG. 5 is a sectional view taken along a line II-II in FIG. 3, and obtained by cutting the plurality of NAND strings 115 and the plurality of contact plugs 18 of the string unit SU0 in a direction (the first direction D1 perpendicular to the second direction D2 and parallel to the semiconductor substrate) parallel to the direction in which the word lines WL extend. Note that no insulating layers are shown in FIG. 5.

The sectional configuration of the cell array region will be described first.

As shown in FIG. 4, an insulating layer 21 is provided on the side surface of each source line contact LI. One string unit SU is arranged between two source line contacts LI to sandwich the insulating layers 21 so the source line contacts LI and the interconnect layers 22 and 23 are not electrically coupled.

In each string unit SU, the NAND strings 115 are formed in a third direction D3 perpendicular to the semiconductor substrate 10. More specifically, an n-type well 11 is provided in the surface region of the semiconductor substrate 10, and a p-type well 12 is provided in the surface region of the n-type well 11. In addition, $n^+$-type diffusion layers 13 are provided in the surface region of the p-type well 12. An insulating layer 20 is provided on the semiconductor substrate 10. The interconnect layer 23 functioning as the select gate line SGS, the four interconnect layers 23 respectively functioning as the word lines WL0 to WL3, the four interconnect layers 22 respectively functioning as word lines WL4 to WL7, and the interconnect layer 22 functioning as the select gate line SGD are sequentially stacked above the insulating layer 20. Insulating layers 20 are provided between the plurality of interconnect layers 22 and 23. For example, silicon oxide films are used for the insulating layers 20.

In the example of FIG. 4, among the plurality of interconnect layers 22 and 23, an upper layer has a narrower interconnect width W in the second direction D2. That is, the interconnect width W of the interconnect layer 22 functioning as the select gate line SGD is narrowest, and the interconnect width W of the interconnect layer 23 functioning as the select gate line SGS is widest. Note that the relationship between the interconnect widths W of the plurality of interconnect layers 22 and 23 is not limited to this. For example, the interconnect widths W of the respective interconnect layers may be equal to each other, or the interconnect width W of the lowermost interconnect layer 23 functioning as the select gate line SGS may be narrowest.

The interconnect layers 22 and 23 have different resistivities. The relationship between the resistivity of the interconnect layer 22 and that of the interconnect layer 23 depends on the shapes of the interconnect layers (the lengths, thicknesses, widths, and the like of the interconnect layers). For example, variations in the resistivities of the interconnect layers are made small by comparing the ratios of the sectional areas of the interconnect layers to the lengths of the interconnect layers, and increasing the resistivity of the interconnect layer having a lower ratio. A case in which the interconnect layer 23 has a resistivity higher than that of the interconnect layer 22 will be exemplified below in this embodiment.

In correspondence with one NAND string 115, one memory pillar MP reaching the p-type well 12 through the plurality of interconnect layers 22 and 23 and the plurality of insulating layers 20 is provided. In the example of FIG. 4, the diameter of the upper surface (opening) of the memory pillar MP is larger than that of the bottom surface contacting the semiconductor substrate 10. The side surface of the memory pillar MP has a tilt angle of 90° or less with respect to the plane of the semiconductor substrate 10 (this shape will be referred to as a "tapered shape" hereinafter). Note that the shape of the memory pillar MP is not limited to the tapered shape. For example, the memory pillar MP may have a cylindrical shape in which the diameter remains the same from the upper surface to the bottom surface, or may have the diameter of the bottom surface larger than that of the upper surface.

The block insulating film 14, the charge storage layer 15, and the tunnel insulating film 16 are sequentially stacked on the side surface of the memory pillar MP, and the semiconductor layer 17 is buried in the memory pillar MP. For example, silicon oxide films are used for the block insulating film 14 and the tunnel insulating film 16. For example, a silicon nitride film is used for the charge storage layer 15. For example, poly-silicon is used for the semiconductor layer 17. The semiconductor layer 17 in the memory pillar MP is a region where a channel is formed when the memory cell transistors MT and the select transistors ST1 and ST2 are ON.

The memory pillar MP and the word lines WL0 to WL7 form the memory cell transistors MT0 to MT7. Similarly, the memory pillar MP and the select gate lines SGD and SGS form the select transistors ST1 and ST2. The upper surface of the memory pillar MP is coupled to the bit line BL (not shown). Note that in the example of FIG. 4, one layer is provided for each of the select gate lines SGD and SGS. However, a plurality of layers may be provided.

Each source line contact LI has a line shape in the first direction D1. For example, poly-silicon is used for the source line contact LI. The source line contact LI has the bottom surface coupled to the $n^+$-type diffusion layer 13, and the upper surface coupled to the source line SL (not shown). The insulating layer 21 is provided on the side surface of the source line contact LI so the source line contact LI and the interconnect layers 22 and 23 are not electrically coupled. For example, a silicon oxide film is used for the insulating layer 21.

The step region will be described next.

As shown in FIG. 5, in the cell array region, the plurality of NAND string 115 (the memory pillars MP) are arranged in the first direction D1. In the step region, one-end sides of the plurality of interconnect layers 22 and 23 extend stepwise in the first direction D1. In the step region, each of the plurality of interconnect layers 22 and 23 is coupled to an upper interconnect layer (not shown) via the corresponding contact plug 18.

The plurality of interconnect layers 22 and 23 extend stepwise. Therefore, as for an interconnect length L of the word line WL from the contact plug 18 to the memory pillar MP, for example, when L1 represents an interconnect length from the contact plug 18 coupled to the word line WL7 to the closest memory pillar MP, and L2 represents an interconnect length from the contact plug 18 coupled to the word line WL0 to the same memory pillar MP, a relationship of L1<L2 is obtained. That is, the interconnect length L from the contact plug 18 to the memory pillar MP is different for each layer, and tends to be longer in a lower layer. Note that the example of FIG. 5 shows a case in which the respective interconnect layers extend stepwise in a row. However, the interconnect layers may have a shape in which steps are arranged in two rows, and the shape of steps can be arbitrarily changed. Furthermore, the example of FIG. 5 shows a case in which the step region is provided on the one-end sides of the word lines WL. However, the similar step region may be provided on the other-end sides.

1.1.5 Sectional Configuration of Word Lines

The sectional configuration of the word lines WL will be described in detail next with reference to FIG. 6. FIG. 6 is a view obtained by extracting the interconnect layer 22 corresponding to the word line WL7 in the uppermost layer and the interconnect layer 23 corresponding to the word line WL0 in the lowermost layer in the string unit SU0 shown in FIG. 4. Note that in the example of FIG. 6, the interconnect layers and the memory pillar MP have rectangular shapes for the sake of descriptive simplicity.

As shown in FIG. 6, the memory pillar MP extends through the interconnect layers 22 and 23 in the memory array region, and thus effective interconnect widths WA and sectional areas S of the interconnect layers are small.

Assume, for example, that thicknesses H of the interconnect layers 22 and 23 are almost equal to each other. When W1 represents the interconnect width of the interconnect layer 22 corresponding to the word line WL7 and W2 represents the interconnect width of the interconnect layer 23 corresponding to the word line WL0, the interconnect widths have a relationship of W1<W2 in the example of FIG. 6. Furthermore, when DM1 represents the diameter of the memory pillar MP in the interconnect layer 22 corresponding to the word line WL7 and DM2 represents the diameter of the memory pillar MP in the interconnect layer 23 corresponding to the word line WL0, the diameters of the memory pillar MP have a relationship of DM1>DM2. An effective interconnect width WA1 of the interconnect layer 22 corresponding to the word line WL7, which is obtained by subtracting the diameter of the memory pillar MP, is given by WA1=W1−DM1. An effective interconnect width WA2 of the interconnect layer 23 corresponding to the word line WL0, which is obtained by subtracting the diameter of the memory pillar MP, is given by WA2=W2−DM2. Since the relationship of W1<W2 and the relationship of DM1>DM2 are satisfied, WA1<WA2 holds. That is, the upper interconnect layer has the narrower effective interconnect width WA.

A sectional area S1 of the interconnect layer 22 corresponding to the word line WL7, which is obtained by subtracting the area of the memory pillar MP, is given by S1=WA1×H. A sectional area S2 of the interconnect layer 23 corresponding to the word line WL0, which is obtained by subtracting the area of the memory pillar MP, is given by S2=WA2×H. Since WA1<WA2 is satisfied, S1<S2 holds. That is, the upper interconnect layer has the smaller effective sectional area.

1.2 Method of Forming Memory Cell Array

A method of forming the memory cell array 111 will be described next with reference to FIGS. 7 to 17. This embodiment will explain a method (to be referred to as "backfilling" hereinafter) of forming the interconnect layers 22 and 23 by forming a structure corresponding to the interconnect layers 22 and 23 using sacrificial layers, and then removing the sacrificial layers and burying conductive layers. A case in which silicon nitride films are used as the sacrificial layers and multilayered films of titanium nitride and tungsten are used as the conductive layers will be described. Titanium nitride has a function as a barrier layer for preventing the reaction of tungsten and underlying silicon or as an adhesion layer for improving the adherence of tungsten at the time of depositing tungsten. Note that the sacrificial layer is not limited to the silicon nitride film. For example, a silicon oxynitride film may be used, and a material whose selectivity of wet etching with the insulating layer 20 (for example, the silicon oxide film) is sufficiently obtained is used. The conductive layer is not limited to the multilayer of titanium nitride and tungsten.

As shown in FIG. 7, the insulating layer 20 (for example, the silicon oxide film) is formed on the upper surface of the semiconductor substrate 10. On the upper surface of the insulating layer 20, a plurality of sacrificial layers 24 (for example, silicon nitride films) and the plurality of insulating layers 20 are alternately stacked. More specifically, the insulating layer 20 is deposited on the semiconductor substrate 10. Then, on the upper surface of the insulating layer 20, the 10 sacrificial layers 24 corresponding to the select gate line SGS, eight word lines WL0 to WL7, and the select gate line SGD and the 10 insulating layers 20 are alternately stacked. After that, the plurality of sacrificial layers 24 are etched to form, for example, the above-described step region.

Next, memory holes MH are formed by dry etching. The shape of each memory hole MH depends on the process characteristic of dry etching, and is, for example, a tapered shape shown in FIG. 7. The block insulating film 14, the charge storage layer 15, and the tunnel insulating film 16 are sequentially deposited, and then etched back to form side walls in the memory holes MH. The semiconductor layer 17 is buried in the memory holes MH. After that, the semiconductor layer 17 deposited on the upper surface of the insulating layer 20 is removed by, for example, chemical mechanical polishing (CMP), thereby forming the memory pillars MP. After the memory pillars MP are formed, the upper surfaces of the memory pillars MP are covered with the insulating layer 20.

Slits SLT are formed to separate the respective string units SU. The shape of each slit SLT depends on the process characteristic of dry etching, and is, for example, a tapered shape shown in FIG. 7. As a result, among the plurality of sacrificial layers 24, an upper layer has a narrower interconnect width in the second direction D2. The side surfaces of the respective sacrificial layers 24 are exposed to the side surfaces of the slits SLT.

Figure 8:
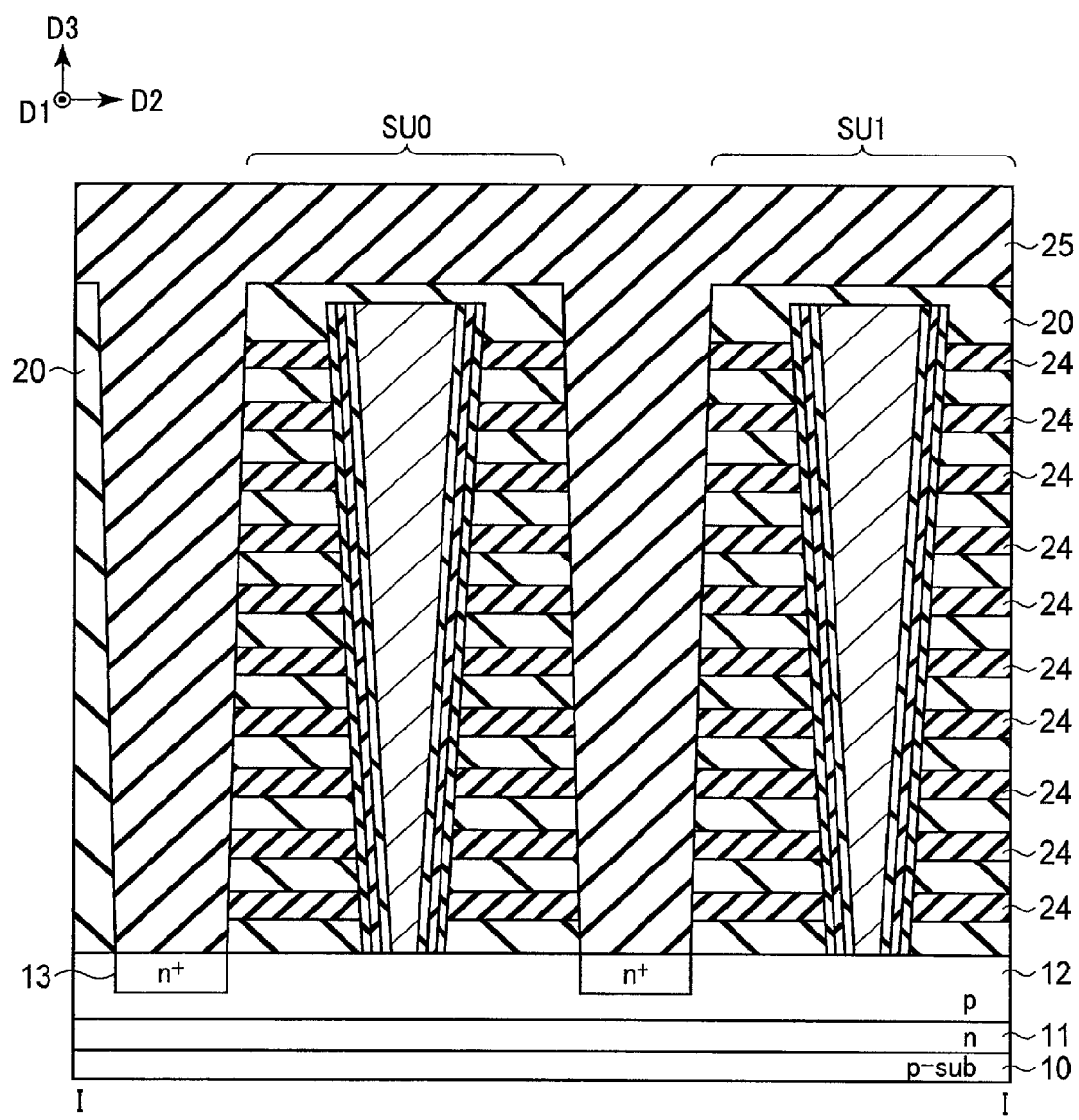

As shown in FIG. 8, a sacrificial layer 25 (for example, a silicon nitride film) is deposited, and buried in the slits SLT. Note that the sacrificial layer 25 is preferably made of the same material as that of the sacrificial layers 24 so as to be removed together with the sacrificial layers 24.

Figure 9:
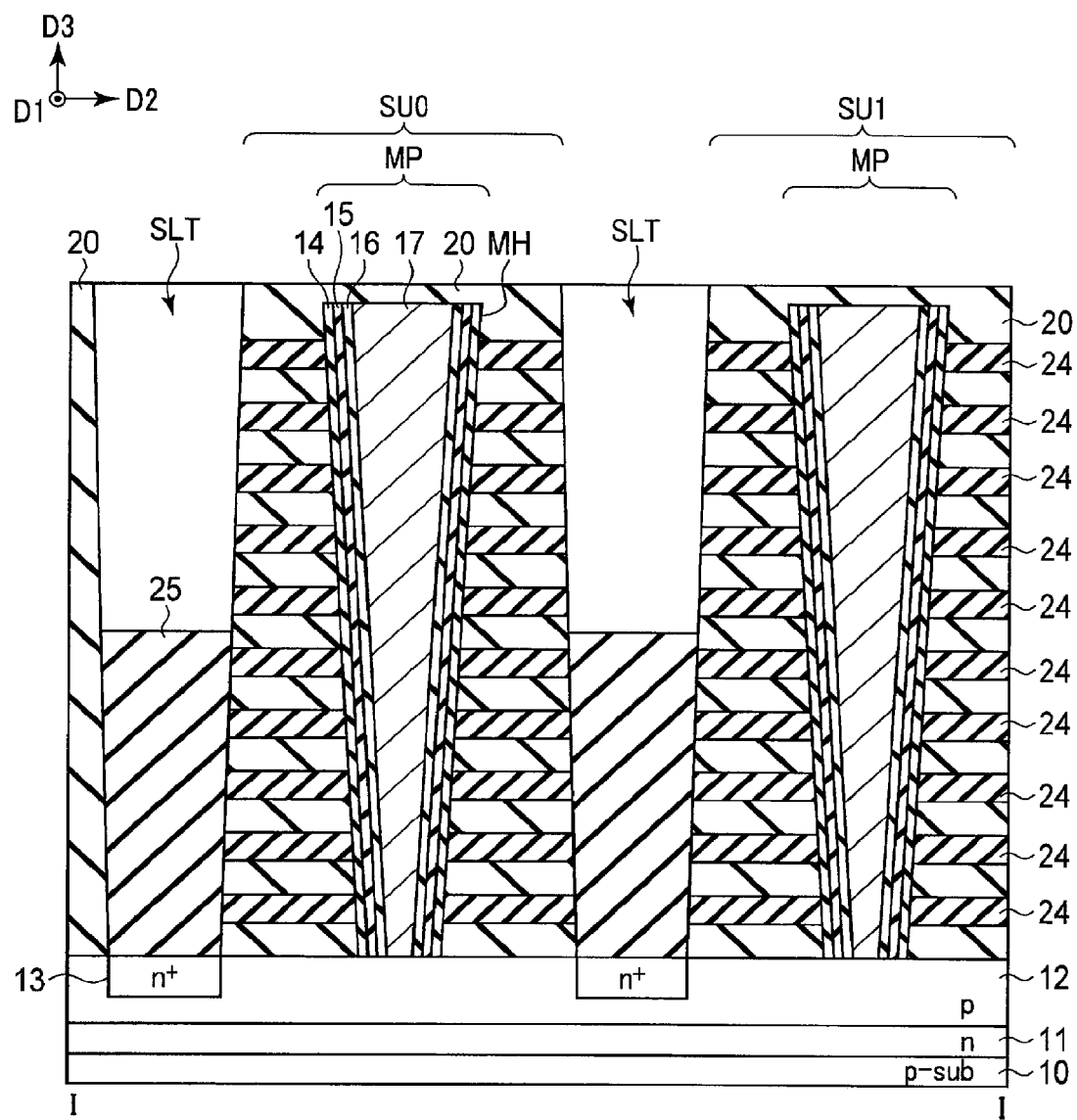

As shown in FIG. 9, in the slits SLT, the sacrificial layer 25 is etched by dry etching until the side surfaces of the sacrificial layers 24 corresponding to the interconnect layers 22, that is, the side surfaces of the five upper sacrificial layers 24 in the example of FIG. 9 are exposed.

As shown in FIG. 10, side walls are formed in the slits SLT by protection layers 26. More specifically, after the protection layer 26 is deposited to cover the entire surfaces, the protection layer 26 is etched so that the protection layer 26 deposited on the upper surfaces of the sacrificial layers 25 and the insulating layer 20 is removed. For example, amorphous silicon film is used for the protection layer 26. Note that the protection layer 26 is not limited to any specific material as long as it is possible to sufficiently obtain the etching selectivity of wet etching with respect to the sacrificial layers 24 and 25.

As shown in FIG. 11, the sacrificial layers 24 and 25 are removed by wet etching. More specifically, for example, if the sacrificial layers 24 and 25 are silicon nitride films, wet etching is performed using phosphoric acid. With this process, the sacrificial layers 25 in the slits SLT are dipped in an etching solution, and then removed. After the sacrificial layers 25 are removed, the side surfaces of the lower five sacrificial layers 24 are dipped in the etching solution, and are thus similarly removed. This forms air gaps corresponding to the interconnect layers 23. At this time, the side surfaces of the upper five sacrificial layers 24 are covered with the protection layers 26, and are thus not etched.

Figure 12:
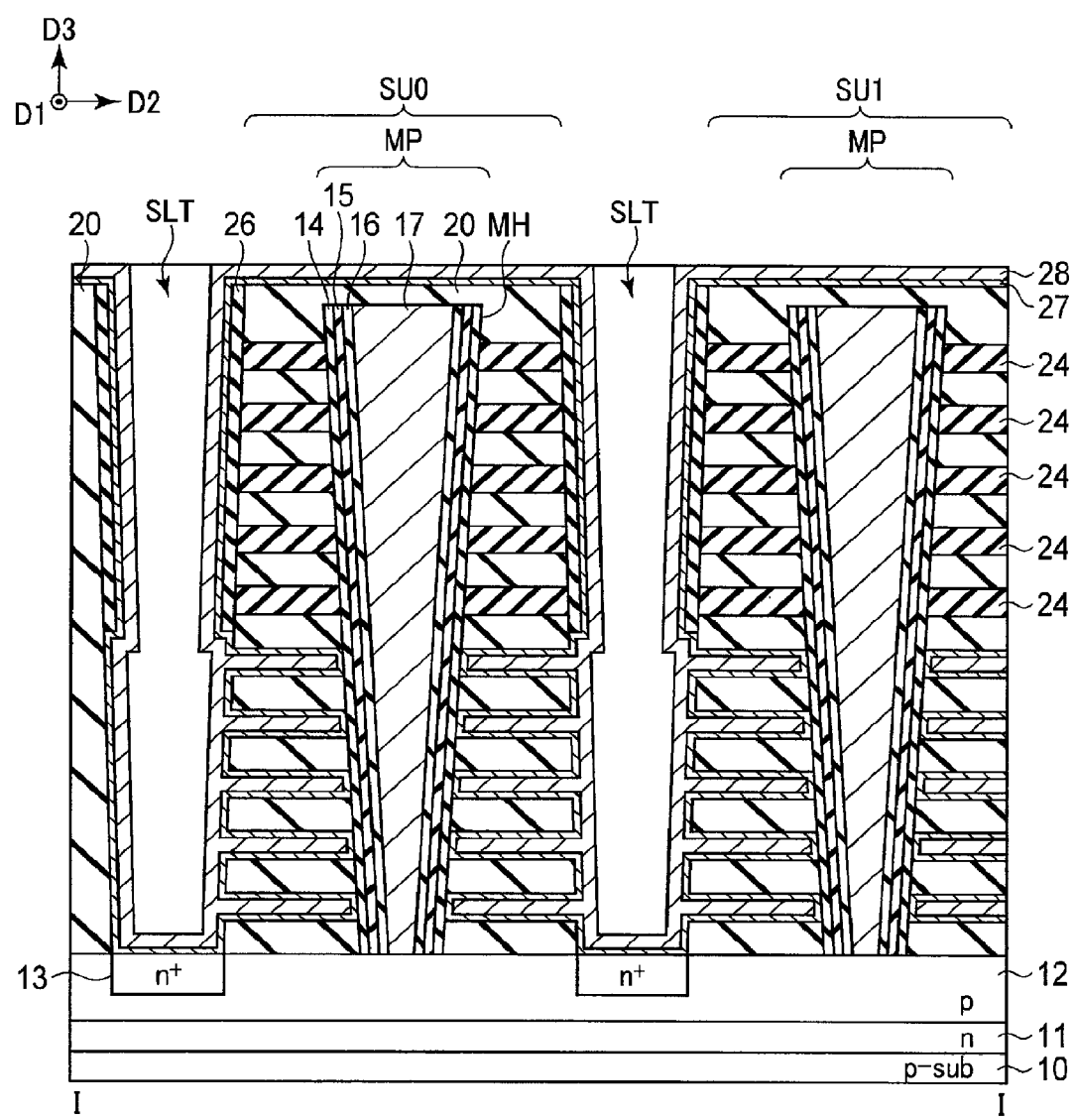

As shown in FIG. 12, a conductive layer 27 (for example, titanium nitride) and a conductive layer 28 (for example, tungsten) are sequentially deposited, and are buried in the regions (air gaps) obtained by removing the lower five sacrificial layers 24. At this time, the conductive layer 28 has a small film thickness to the extent that the conductive layer 28 is not completely buried in the slits SLT.

As shown in FIG. 13, the conductive layers 27 and 28 deposited on the upper surface of the insulating layers 20 and in the slits SLT are removed by, for example, dry etching. This forms the interconnect layers 23 using the conductive layers 27 and 28.

Figure 14:
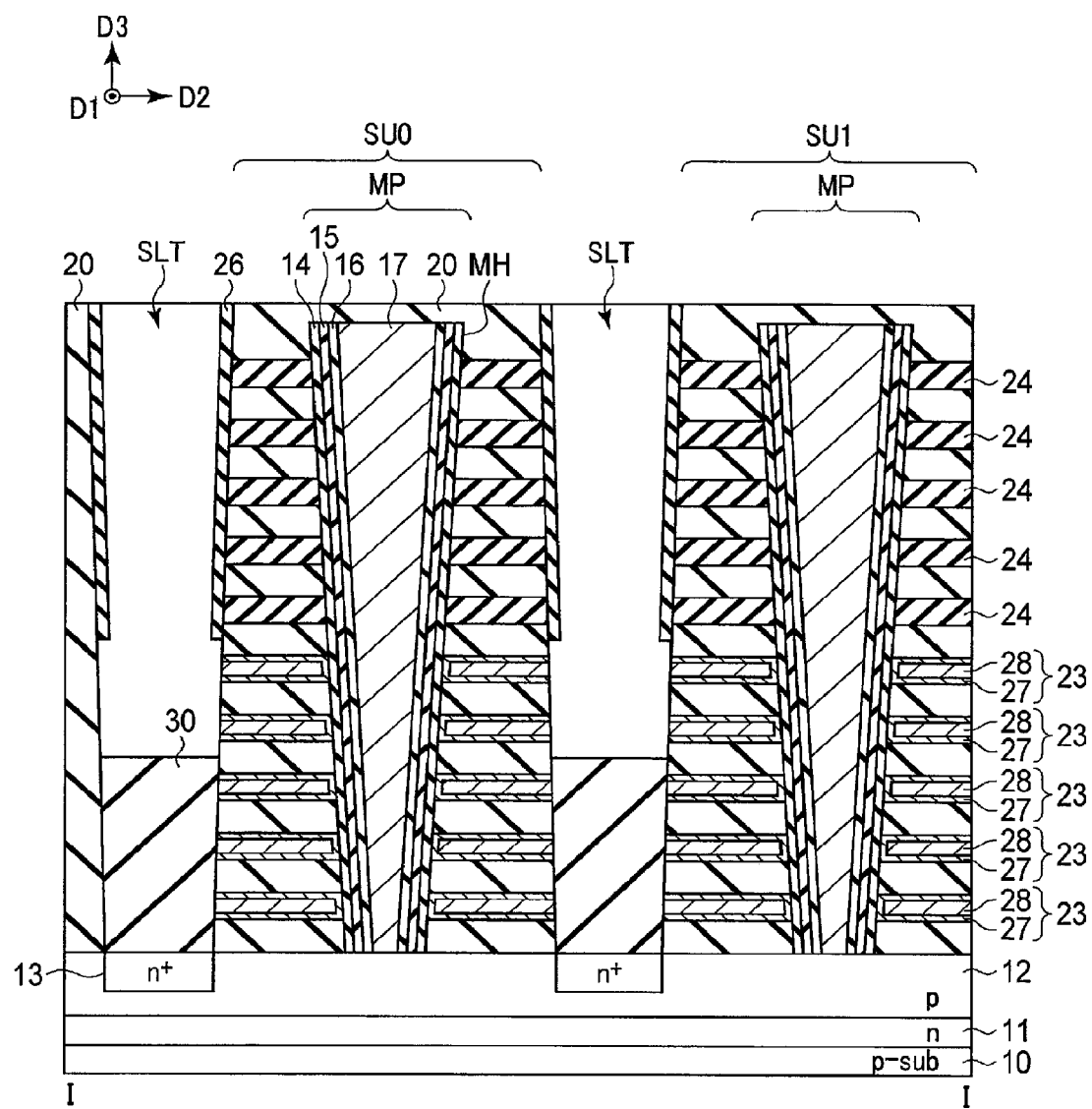

As shown in FIG. 14, resists 30 are buried in the bottom portions of the slits SLT. More specifically, the resist 30 is coated first. The resist 30 is then etched to remain in the bottom portions of the slits SLT. The resists 30 protect the semiconductor substrate 10 exposed to the bottom surfaces of the slits SLT at the time of removing the protection layers 26. The thicknesses (the heights in the third direction D3) of the resists 30 remaining in the slits SLT are set to thicknesses to the extent that the protection layers 26 are completely exposed and the semiconductor substrate 10 on the bottom surfaces of the slits SLT can be protected.

Figure 15:
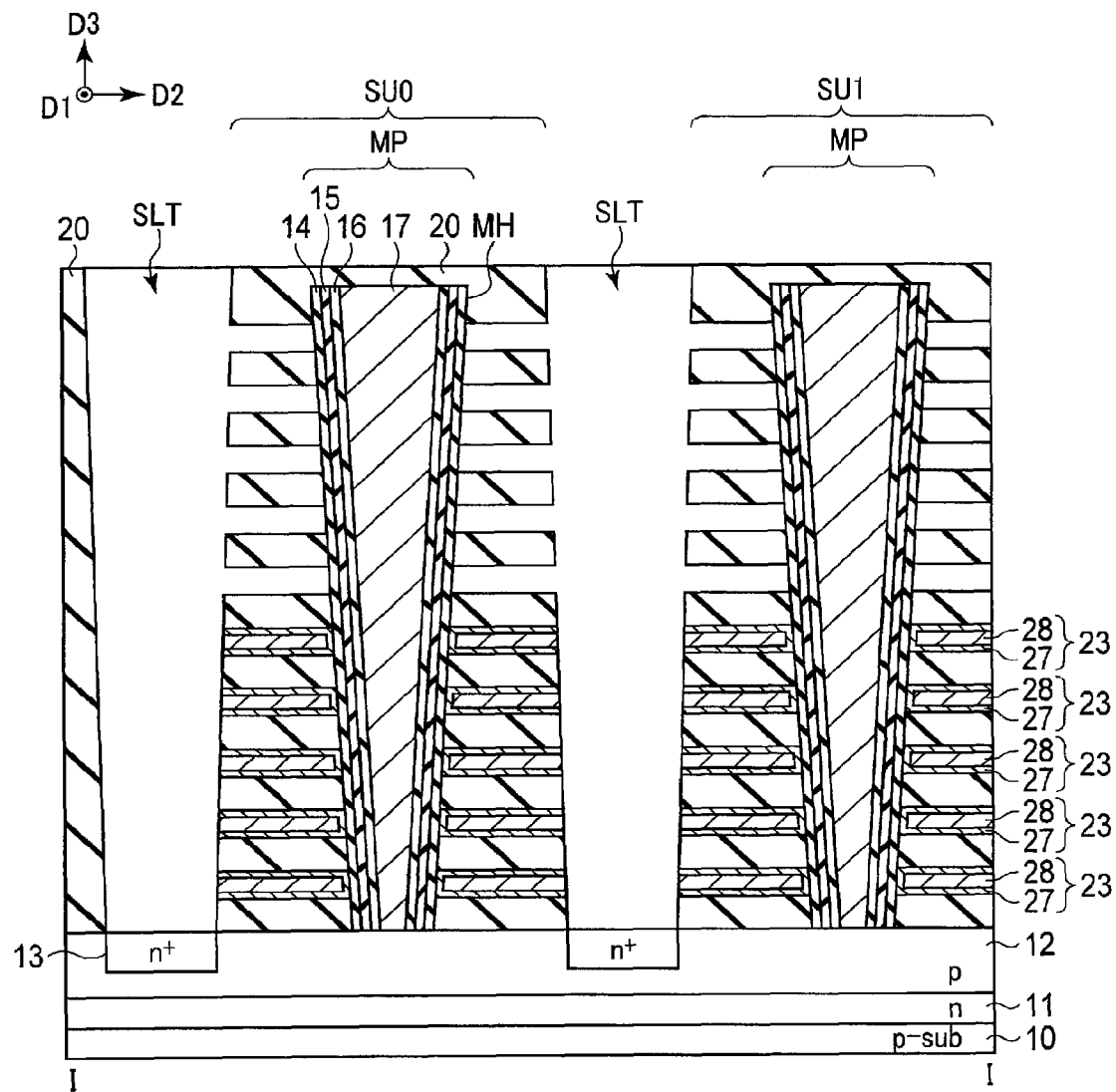

As shown in FIG. 15, the sacrificial layers 24, the protection layers 26, and the resists 30 are removed. More specifically, the protection layers 26 are removed by, for example, wet etching. Next, the upper five sacrificial layers 24 are removed by wet etching. This forms air gaps corresponding to the interconnect layers 22. After that, the resists 30 in the bottom portions of the slits are released. Note that after the resists 30 are released, the sacrificial layers 24 may be wet-etched.

As shown in FIG. 16, the conductive layer 27 (for example, titanium nitride) and a conductive layer 29 (for example, tungsten) are sequentially deposited, and buried in the regions (air gaps) obtained by removing the upper five sacrificial layers 24. At this time, assume that the conductive layer 29 has a film thickness to the extent that the conductive layer 29 is not completely buried in the slits SLT. A film having a resistivity lower than that of the conductive layer 28 is used for the conductive layer 29. More specifically, for example, if tungsten deposited by chemical vapor deposition (CVD) is used for the conductive layers 28 and 29, it is possible to change the film composition (the impurity concentration in the film) by changing the deposition conditions (for example, a deposition temperature, the conditions of a deposition gas, and the like), thereby depositing tungsten films having different resistivities. Therefore, using different deposition conditions, the resistivity of tungsten corresponding to the conductive layers 28 is set higher than that of tungsten corresponding to the conductive layers 29. Note that this embodiment has explained a case in which the resistivities of the conductive layers 28 and 29 are different. However, the conductive layer 27 (for example, titanium nitride) corresponding to the interconnect layer 22 and the conductive layer 27 corresponding to the interconnect layer 23 may have different resistivities. Furthermore, different conductive materials may be used for the interconnect layers 22 and 23.

As shown in FIG. 17, the conductive layers 27 and 29 deposited on the upper surface of the insulating layers 20 and in the slits SLT are removed. This forms the interconnect layers 22 using the conductive layers 27 and 29. After that, as shown in FIG. 3, side walls are formed on the side surfaces of the slits by the insulating layers 21, and semiconductor layers are buried in the slits SLT, thereby forming the source line contacts LI.

1.3 Relationship Between Film Property and Resistivity of Conductive Layer

The relationship between the film properties (film compositions) and resistivities of the conductive layers 28 and 29 will be described. As an example in which the film properties of the conductive layers 28 and 29 are different, a case in which tungsten films having different impurity (fluorine) concentrations in them are used for the conductive layers 28 and 29 will be described with reference to FIG. 18. The example of FIG. 18 shows a result of measuring, by secondary ion mass spectrometry (SIMS), the relationship between the resistivity and the fluorine concentration in the tungsten film when depositing tungsten by CVD using tungsten hexafluoride ($WF_6$) and a reducing gas (for example, $H_2$, $SiH_4$, or $B_2H_6$).

As shown in FIG. 18, as the fluorine concentration (the impurity concentration in the tungsten film) rises, the resistivity of tungsten tends to rise. For example, while the resistivity of tungsten when the fluorine concentration is $1.5 \times 10^{19}$ atoms/cm$^3$ is about 16 $\mu\Omega\cdot$cm, the resistivity of tungsten when the fluorine concentration is $2 \times 10^{20}$ atoms/cm$^3$ is about 21 $\mu\Omega\cdot$cm, which indicates that the resistivity rises by about 30%. The fluorine concentration can be controlled by, for example, the deposition temperature. More specifically, if the deposition temperature is raised, the reaction of $WF_6$ and the reducing gas progresses more, and thus the fluorine concentration tends to become low.

In this embodiment, for example, when depositing the conductive layer 28, tungsten is deposited under the condition that the fluorine concentration (impurity concentration) becomes high. When depositing the conductive layer 29, tungsten is deposited under the condition that the fluorine concentration (impurity concentration) becomes low. This sets the resistivity of the conductive layer 28 higher than that of the conductive layer 29. The difference between the film compositions (fluorine concentrations) of the conductive layers 28 and 29 can be measured using SIMS, Auger electron spectroscopy (AES), electron energy loss spectroscopy (EELS), or the like.

Note that the resistivities of the conductive layers 28 and 29 may be changed by changing the film densities, crystal orientations, grain sizes, or the like of the conductive layers instead of the film compositions (impurity concentrations). In addition, the impurity is not limited to fluorine and may be another element (for example, carbon, oxygen, or nitrogen).

1.4 Effect of Embodiment

The configuration according to this embodiment can improve the reliability. This effect will be described below.

In the 3D stacked NAND flash memory, the plurality of interconnect layers used as the plurality of word lines WL coupled to one NAND string 115 are stacked above the semiconductor substrate. The plurality of stacked interconnect layers extend stepwise, and are respectively coupled to, via the contact plugs 18, interconnects provided above the NAND string 115. Thus, the interconnect layers used as the word lines WL have different interconnect lengths L from the contact plugs 18 to the NAND string 115 for the respective layers. More specifically, the upper interconnect layer has the shorter interconnect length L.

Furthermore, due to the process characteristic of dry etching when forming the memory holes MH and the slits SLT, the sectional area S (for example, interconnect width WA) of the interconnect layer used as the word line WL may be different depending on the layer formed above the semiconductor substrate. More specifically, if the slits SLT and the memory holes MH have tapered shapes, the interconnect width WA of the upper interconnect layer is narrower than that of the lower interconnect layer. Therefore, when the thicknesses H of the respective interconnect layers are uniform, the sectional area S of the upper interconnect layer is smaller than that of the lower interconnect layer.

If the interconnect layers used as the word lines WL have the different interconnect lengths L and the different sectional areas S (for example, interconnect widths WA) for the respective layers, when the resistivities of the interconnect layers are equal to each other, resistances R are different for the respective interconnect layers. The resistance R is proportional to the resistivity and interconnect length L of the interconnect layer, and is inversely proportional to the sectional area S of the interconnect. That is, the resistance R is proportional to L/S. If, therefore, the thicknesses H of the interconnect layers are almost equal to each other, the resistance R is inversely proportional to the interconnect width WA. That is, the resistance R is proportional to L/WA. For example, when the sectional areas S (interconnect widths WA) of the respective interconnect layers are equal to each other, the resistance R becomes higher as the interconnect length L is longer. If the interconnect lengths L of the respective interconnect layers are equal to each other, the resistance R becomes lower as the sectional area S (interconnect width WA) of the interconnect layer is larger.

The propagation speed of a signal in the word line WL is inversely proportional to the product of the resistance R of the word line WL and a capacitance C between the word lines WL. Assuming that the difference in capacitance C between the word lines WL is small, the propagation speeds of signals in the respective word lines WL are different due to the difference in resistance R. For this reason, in the one NAND string 115, the timing at which the voltage of the word line WL is applied to each memory cell transistor MT is different for each interconnect layer used as the word line WL. This increases the possibility that an erroneous operation occurs in write, erase, and read operations. For example, in a write operation, variations in threshold voltages when writing to the memory cell transistors MT may become large. As a result, a data write error increases, thereby posing a problem that the operation time for error correction is prolonged.

To solve this problem, in the configuration according to this embodiment, among the interconnect layers used as the word lines WL, an electric conductor having a low resistivity is used for an interconnect layer having a relatively high ratio (L/S) between the interconnect length L and the sectional area S, as compared with the remaining interconnect layers, and an electric conductor having a high resistivity is used for an interconnect layer having a relatively low L/S (that is, L/WA). This can reduce variations in the resistances R in the plurality of word lines WL, thereby suppressing variations in the propagation speeds of signals in the respective word lines WL. Thus, in the one NAND string 115, it is possible to suppress variations in the timings at which the voltages of the word lines WL are applied to the memory cell transistors MT. Therefore, it is possible to suppress an erroneous operation in write, erase, and read operations, thereby suppressing the variations in the threshold voltages in the write operation. As a result, the reliability of the semiconductor memory device improves.

Furthermore, in the configuration according to this embodiment, the resistivity of the word line WL can be controlled by controlling the film compositions of the conductive layers included in the interconnect layer used as the word line WL. For example, the resistivity of the conductive layer can be controlled by using tungsten for the conductive layer and controlling the impurity (fluorine) concentration in tungsten. This can control the resistivity of the word line WL.

Note that this embodiment has explained a case in which the resistivity of the interconnect layer 22 is low, and the resistivity of the interconnect layer 23 is high. The present invention, however, is not limited to this. For example, depending on the shapes of the interconnect layers, the resistivity of the interconnect layer 22 may be set higher than that of the interconnect layer 23. Although the two kinds of interconnect layers having the different resistivities have been explained, three or more kinds of interconnect layers may be used.

2. Second Embodiment

The second embodiment will be described next. The difference from the first embodiment is that the film thickness ratio between conductive layers 27 and 29 is controlled as a method of controlling the resistivity of a word line WL. Only the difference from the first embodiment will be described below.

2.1 Sectional Configuration of Memory Cell Array

The sectional configuration of a memory cell array 111 will be described first with reference to FIG. 19.

As shown in FIG. 19, a multilayered film of the conductive layer 27 (for example, titanium nitride) and the conductive layer 29 (for example, tungsten) is used for each of interconnect layers 22 and 23 according to this embodiment. The ratio between the film thicknesses of the conductive layers 27 and 29 is different between the interconnect layers 22 and 23. If, for example, the resistivity of the conductive layer 27 is higher than that of the conductive layer 29, the film thickness of the conductive layer 27 used for the interconnect layer 23 is made larger than that of the conductive layer 27 used for the interconnect layer 22. As a result, the ratio of the conductive layer 29 to the interconnect layer 23 is lower than that of the conductive layer 29 to the interconnect layer 22. Since the resistivity of the conductive layer 27 is higher than that of the conductive layer 29, the resistivity of the interconnect layer 23 is higher than that of the interconnect layer 22.

2.2 Effect of Embodiment

In the configuration according to this embodiment, it is possible to obtain the same effect as in the first embodiment.

In the configuration according to this embodiment, it is possible to control the resistivity of each interconnect layer by controlling the ratio between the film thicknesses of the plurality of conductive layers used for the interconnect layer while paying attention to the difference between the resistivities of the conductive layers. For example, if titanium nitride having a resistivity of about 200 μΩ·cm is used for the conductive layer 27 and tungsten having a resistivity of about 20 μΩ·cm is used for the conductive layer 29, as the film thickness of titanium nitride is larger, the ratio of tungsten to the interconnect layer decreases, and thus the resistivity of the interconnect layer becomes high. Therefore, if the plurality of conductive layers having different resistivities are used for the interconnect layer of the word line WL, the resistivity of the interconnect layer can be controlled by controlling the ratio between the film thicknesses of the conductive layers. Therefore, in one NAND string 115, it is possible to reduce variations in resistances R in the plurality of word lines WL, thereby suppressing variations in the timings at which the voltages are applied to the respective word lines WL. As a result, the reliability of the semiconductor memory device improves.

3. Third Embodiment

The third embodiment will be described next. The difference from the first and second embodiments is that a NAND string 115 includes a plurality of memory pillars MP. Only the difference from the first and second embodiments will be described below.

3.1 Sectional Configuration of Memory Cell Array

The sectional configuration of a memory cell array 111 will be described first with reference to FIG. 20.

As shown in FIG. 20, the NAND string 115 according to this embodiment includes two memory pillars MP stacked in a third direction D3. More specifically, a memory pillar MP1 coupled to a semiconductor substrate 10 through a plurality of insulating layers 20 and interconnect layers 23 corresponding to word lines WL0 to WL3 and a select gate line SGS is provided. A memory pillar MP2 coupled to the upper surface of the memory pillar MP1 through a plurality of insulating layers 20 and interconnect layers 22 corresponding to word lines WL4 to WL7 and a select gate line SGD is provided in the third direction D3. In the example of FIG. 20, each of the memory pillars MP1 and MP2 has a tapered shape.

3.2 Method of Forming Memory Cell Array

A method of forming the memory cell array 111 will be described next with reference to FIGS. 21 to 25.

As shown in FIG. 21, the memory pillars MP1 and slits are formed. More specifically, the insulating layer 20 (for example, a silicon oxide film) is formed on the upper surface of the semiconductor substrate 10. On the upper surface of the insulating layer 20, a plurality of sacrificial layer 24 (for example, silicon nitride films) corresponding to the interconnect layers 23 and the plurality of insulating layers 20 are alternately stacked. Next, the memory pillars MP1 each coupled to the semiconductor substrate 10 through the plurality of sacrificial layers 24 and the insulating layers 20 are formed, and the upper surfaces of the memory pillars MP1 are covered with the insulating layer 20. After that, slits SLT1 are formed to separate string units SU.

As shown in FIG. 22, the sacrificial layers 24 are removed, and the interconnect layers 23 are formed using a conductive layer 27 (for example, titanium nitride) and a conductive layer 28 (for example, tungsten). More specifically, the sacrificial layers 24 are removed by wet etching. Next, the conductive layers 27 and 28 are sequentially deposited, and buried in regions obtained by removing the sacrificial layers 24. At this time, the conductive layer 28 has a small film thickness to the extent that the conductive layer 28 is not completely buried in the slits SLT. After that, for example, the conductive layers 27 and 28 deposited on the upper surface of the insulating layers 20 and in the slits SLT1 are removed by, for example, dry etching.

As shown in FIG. 23, sacrificial layer 25 (for example, silicon nitride films) is buried in the slits SLT. More specifically, after the sacrificial layer 25 is deposited and buried in the slits SLT, the sacrificial layer 25 deposited on the upper surface of the insulating layer 20 is removed by etching.

As shown in FIG. 24, the sacrificial layers 24 corresponding to the interconnect layers 22, the memory pillars MP2, and slits SLT2 are formed. More specifically, the plurality of sacrificial layers 24 corresponding to the interconnect layers 22 and the plurality of insulating layers 20 are alternately stacked on the upper surface of the insulating layer 20. The memory pillars MP2 each coupled to the corresponding memory pillar MP1 through the plurality of sacrificial layers 24 and the insulating layers 20 are formed, and the upper surfaces of the memory pillars MP2 are covered with the insulating layer 20. After that, the sacrificial layers 24 of the respective string units SU are separated to form the slits SLT2 so that their bottom surfaces reach the corresponding sacrificial layers 25, respectively.

As shown in FIG. 25, the interconnect layers 22 are formed. More specifically, the sacrificial layers 24 and 25 are removed by wet etching. Next, the conductive layer 27 and a conductive layer 29 (for example, tungsten) having a resistivity different from that of the conductive layer 28 are sequentially deposited, and buried in regions obtained by removing the sacrificial layers 24. At this time, the conductive layer 29 has a small film thickness to the extent that the conductive layer 29 is not completely buried in the slits SLT. After that, the conductive layers 27 and 29 deposited on the upper surfaces of the insulating layers 20 and in the slits SLT are removed by, for example, dry etching.

After that, as shown in FIG. 20, side walls are formed on the side surfaces of the slits by insulating layers 21, and semiconductor layers are buried in the slits SLT, thereby forming source line contacts LI.

3.3 Effect of Embodiment

In the configuration according to this embodiment, it is possible to obtain the same effect as in the first and second embodiments.

In the configuration according to this embodiment, since formation of the sacrificial layers 24 corresponding to the interconnect layers and the memory pillars MP and back-filling of the interconnect layers are alternately performed, it is possible to eliminate steps of, for example, forming and removing the protection layers 26. It is, thus, possible to suppress an increase in number of manufacturing steps. Therefore, an increase in manufacturing period and an increase in manufacturing cost can be suppressed.

4. Modifications and Others

The semiconductor memory device according to each of the above embodiments includes a first interconnect layer (23(WL) in FIGS. 4 and 17) provided on a first insulating layer above a semiconductor substrate and including a first conductive layer (28 in FIG. 17), a second interconnect layer (22(WL) in FIGS. 4 and 17) provided on a second insulating layer above the first interconnect layer and including a second conductive layer (29 in FIG. 17) having a film composition different from that of the first conductive layer, and a pillar extending through the first and second insulating layers and the first and second interconnect layers and including a semiconductor layer, and a third insulating layer, a charge storage layer, and a fourth insulating layer, which are stacked on a side surface of the semiconductor layer.

By applying the above embodiments, it is possible to provide a semiconductor memory device capable of improving the reliability and a method of manufacturing the same. Note that embodiments are not limited to the above-described ones, and various modifications can be made.

For example, each of the above embodiments has explained the method of forming the interconnect layers 22 and 23 by forming the structure corresponding to the interconnect layers 22 and 23 using the sacrificial layers 24, and then removing the sacrificial layers 24 and back-filling conductive layers. The memory pillars MP and the slits SLT may be formed after forming a stacked structure of the insulating layers 20 and the interconnect layers 22 and 23 each formed by the conductive layers without using any sacrificial layers.

Furthermore, the above embodiments may be combined as much as possible. For example, the first and second embodiments may be applied. For example, the conductive layers 28 and 29 having different resistivities may be applied to the interconnect layers 22 and 23, respectively, and the conductive layers 27 having different film thicknesses may be applied to the interconnect layers 22 and 23, respectively.

Furthermore, in the third embodiment, the resistivities of the plurality of interconnect layers extending through one memory pillar MP may be different. In FIG. 20, for example, the resistivity of the interconnect layers 23 corresponding to the select gate line SGS and the word line WL0 may be different from that of the interconnect layers 23 corresponding to the word lines WL1 to WL3.

Furthermore, in the above embodiments, the relationship in which the resistivities of the conductive layers 28 and 29 are different, the relationship in which the impurity concentrations of the conductive layers 28 and 29 are different, and the relationship in which the film thicknesses of the conductive layers 27 in the interconnect layers 22 and 23 are different include no relationship generated by manufacturing variations. For example, a case in which the conductive layers 28 and 29 are deposited under the same conditions but a variation of about 10% occurs between the resistivity of the conductive layer 28 and that of the conductive layer 29 due to manufacturing variations is not included.

In addition, each of the above embodiments has explained a case in which the resistivity of the interconnect layer is changed in accordance with the ratio between the interconnect length L and the sectional area S of the interconnect layer used as the word line WL. However, the resistivity of the interconnect layer may be changed in accordance with one of the interconnect length L and the sectional area S.

Furthermore, the above embodiments are applicable to a 3D stacked NAND flash memory different from those according to the first to third embodiments. For example, the semiconductor layer of the NAND string 115 may have a U-shaped configuration in the upper direction of the semiconductor substrate. Furthermore, the embodiments are not limited to the NAND flash memory, and are applicable to a semiconductor memory device using another memory element.

The term "connect" or "couple" in the above embodiments includes indirect coupling via another element such as a transistor or resistance.

Note that in each embodiment of the present invention, the following conditions may be used. Assume, for example, that the memory cell transistor MT can hold 2-bit (4-value) data, and the threshold levels when the four values are respectively held are set as E-level (erase level), A-level, B-level, and C-level in ascending order of threshold level.

(1) In the read operation,
a voltage applied to a selected word line in a read operation of A-level is, for example, 0 V to 0.55 V. The voltage is not limited to this, and may be 0.1 V to 0.24 V, 0.21 V to 0.31 V, 0.31 V to 0.4 V, 0.4 V to 0.5 V, or 0.5 V to 0.55 V.

A voltage applied to a selected word line in a read operation of B-level is, for example, 1.5 V to 2.3 V. The voltage is not limited to this, and may be 1.65 V to 1.8 V, 1.8 V to 1.95 V, 1.95 V to 2.1 V, or 2.1 V to 2.3 V.

A voltage applied to a selected word line in a read operation of C-level is, for example, 3.0 V to 4.0 V. The voltage is not limited to this, and may be 3.0 V to 3.2 V, 3.2 V to 3.4 V, 3.4 V to 3.5 V, 3.5 V to 3.6 V, or 3.6 V to 4.0 V.

The time (tR) of the read operation can be, for example, 25 µs to 38 µs, 38 µs to 70 µs, or 70 µs to 80 µs.

(2) A write operation includes a program operation and a verify operation, as described above. In the write operation, a voltage first applied to a selected word line at the time of the program operation is, for example, 13.7 V to 14.3 V. The voltage is not limited to this, and may be, for example, 13.7 V to 14.0 V or 14.0 V to 14.6 V.

A voltage first applied to a selected word line when writing to an odd-numbered word line and a voltage first applied to a selected word line when writing to an even-numbered word line may be different.

When the program operation is performed by the ISPP (Incremental Step Pulse Program) method, a step-up voltage is, for example, about 0.5 V.

A voltage applied to an unselected word line can be, for example, 6.0 V to 7.3 V. The voltage is not limited to this, and may be, for example, 7.3 V to 8.4 V, or 6.0 V or less.

The pass voltage to be applied may be changed depending on whether the unselected word line is an odd-numbered word line or an even-numbered word line.

The time (tProg) of the write operation can be, for example, 1,700 µs to 1,800 µs, 1,800 µs to 1,900 µs, or 1,900 µs to 2,000 µs.

(3) In an erase operation,
a voltage first applied to a well formed in the upper portion of the semiconductor substrate and having a memory cell arranged above is, for example, 12 V to 13.6 V. The voltage is not limited to this, and may be, for example, 13.6 V to 14.8 V, 14.8 V to 19.0 V, 19.0 V to 19.8 V, or 19.8 V to 21 V.

The time (tErase) of the erase operation can be, for example, 3,000 µs to 4,000 µs, 4,000 µs to 5,000 µs, or 4,000 µs to 9,000 µs.

(4) The structure of the memory cell includes
a charge storage layer arranged on a 4 to 10 nm thick tunnel insulating film on the semiconductor substrate (silicon substrate). The charge storage layer can have a stacked structure including a 2 to 3 nm thick insulating film made of SiN, SiON, or the like and a 3 to 8 nm thick poly-silicon film. A metal such as Ru may be added to poly-silicon. An insulating film is formed on the charge storage layer. This insulating film includes, for example, a 4 to 10 nm thick silicon oxide film sandwiched between a 3 to 10 nm thick lower high-k film and a 3 to 10 nm thick upper high-k film. The high-k films are made of, for example, HfO. The silicon oxide film can be thicker than the high-k films. A 30 to 70 nm thick control electrode is formed on a 3 to 10 nm thick material for work function adjustment on the insulating film. The material for work function adjustment is a metal oxide film such as TaO or a metal nitride film such as TaN. W or the like can be used for the control electrode.

An air gap can be formed between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a first interconnect layer provided on a first insulating layer above a semiconductor substrate and including a first conductive layer;
a second interconnect layer provided on a second insulating layer above the first interconnect layer and including a second conductive layer having a composition different from that of the first conductive layer; and a pillar extending through the first and second insulating layers and the first and second interconnect layers and including a semiconductor layer, and a third insulating layer, a charge storage layer, and a fourth insulating layer, which are stacked on a side surface of the semiconductor layer.

2. The device according to claim 1, wherein a resistivity of the first conductive layer is different from a resistivity of the second conductive layer.

3. The device according to claim 1, wherein
the first and second conductive layers are made of the same element, and
a concentration of an impurity contained in the first conductive layer is different from a concentration of an impurity contained in the second conductive layer.

4. The device according to claim 1, wherein each of the first and second conductive layers contains tungsten.

5. The device according to claim 3, wherein the impurity contained in each of the first and second conductive layers is fluorine.

6. The device according to claim 3, wherein the concentration of the impurity contained in the first conductive layer is higher than the concentration of the impurity contained in the second conductive layer.

7. The device according to claim 1, wherein
the first interconnect layer further including a first barrier layer covering part of the first conductive layer,
the second interconnect layer further including a second barrier layer covering part of the second conductive layer, and
each of the first and second barrier layers contains titanium nitride.

8. The device according to claim 7, wherein
the first barrier layer covers an upper surface, a bottom surface, and one side surface of the first conductive layer, and contacts a side surface of the pillar, and
the second barrier layer covers an upper surface, a bottom surface, and one side surface of the second conductive layer, and contacts a side surface of the pillar.

9. The device according to claim 1, further comprising:
a first plug having a bottom surface contacting the first interconnect layer; and
a second plug having a bottom surface contacting the second interconnect layer,
wherein when a length of the first interconnect layer from the first plug to the pillar is set as a first interconnect length,
a length of the second interconnect layer from the second plug to the pillar is set as a second interconnect length,
a sectional area of the first interconnect layer in a direction perpendicular to a direction in which the first interconnect layer extends is set as a first area in a region where the pillar extends through the first interconnect layer,
a sectional area of the second interconnect layer in a direction perpendicular to a direction in which the second interconnect layer extends is set as a second area in a region where the pillar extends through the second interconnect layer,
a ratio between the first interconnect length and the first area is set as a first ratio, and
a ratio between the second interconnect length and the second area is set as a second ratio,
a resistivity of one of the first and second interconnect layers, which has a higher one of the first ratio and the second ratio, is lower than a resistivity of other of the first and second interconnect layers, which has a lower ratio.

10. The device according to claim 1, wherein
the pillar includes a first pillar and a second pillar,
the first pillar extends through the first interconnect layer and includes the semiconductor layer, and the third insulating layer, the charge storage layer, and the fourth insulating layer, which are stacked on the side surface of the semiconductor layer, and
the second pillar extends through the second interconnect layer, has a bottom surface contacting an upper surface of the first pillar, and includes the semiconductor layer, and the third insulating layer, the charge storage layer, and the fourth insulating layer, which are stacked on the side surface of the semiconductor layer.

* * * * *